(12) United States Patent
Jeong et al.

(10) Patent No.: US 11,631,672 B2
(45) Date of Patent: Apr. 18, 2023

(54) SEMICONDUCTOR INTEGRATED CIRCUIT

(71) Applicant: Samsung Electronics Co., Ltd., Suwon-si (KR)

(72) Inventors: Jinwoo Jeong, Suwon-si (KR); Raheel Azmat, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 262 days.

(21) Appl. No.: 16/997,335

(22) Filed: Aug. 19, 2020

(65) Prior Publication Data

US 2021/0183859 A1    Jun. 17, 2021

(30) Foreign Application Priority Data

Dec. 17, 2019   (KR) .......................... 10-2019-0168560

(51) Int. Cl.
*H01L 27/092* (2006.01)
*H01L 27/02* (2006.01)

(52) U.S. Cl.
CPC ...... *H01L 27/0924* (2013.01); *H01L 27/0207* (2013.01)

(58) Field of Classification Search
CPC ............ H01L 27/0924; H01L 27/0207; H01L 29/0673; H01L 29/775; H01L 29/78696; H01L 29/42392; H01L 27/088; H01L 27/105; B82Y 10/00
See application file for complete search history.

(56) References Cited

U.S. PATENT DOCUMENTS

| | | | |
|---|---|---|---|
| 8,987,128 B2 * | 3/2015 | Rashed | H01L 27/0207 257/E21.59 |
| 9,117,050 B2 | 8/2015 | Becker et al. | |
| 9,213,792 B2 * | 12/2015 | Becker | G06F 30/392 |
| 9,418,728 B2 | 8/2016 | Liaw | |
| 9,563,733 B2 * | 2/2017 | Becker | G06F 30/392 |
| 9,659,871 B2 | 5/2017 | Azmat et al. | |
| 10,177,133 B2 | 1/2019 | Young et al. | |
| 10,366,196 B2 | 7/2019 | Correale et al. | |
| 10,387,500 B2 | 8/2019 | Hong et al. | |
| 2016/0343661 A1 | 11/2016 | Gupta et al. | |
| 2018/0158811 A1 * | 6/2018 | Subhash | H01L 23/5283 |
| 2018/0315709 A1 | 11/2018 | Schultz | |

* cited by examiner

*Primary Examiner* — Jonathan Han
(74) *Attorney, Agent, or Firm* — Muir Patent Law, PLLC

(57) ABSTRACT

A semiconductor integrated circuit includes a substrate, and a standard cell on the substrate. The standard cell includes a first wiring structure electrically connecting a first gate pattern to a fourth gate pattern, and a second wiring structure electrically connecting a second gate pattern to a third gate pattern. The first wiring structure includes a first lower wiring layer, a second lower wiring layer, first and second intermediate wiring layers, and a first upper wiring layer. The second wiring structure includes a third lower wiring layer, a fourth lower wiring layer, third and fourth intermediate wiring layers, and a second upper wiring layer.

20 Claims, 13 Drawing Sheets

SEMICONDUCTOR INTEGRATED CIRCUIT

CROSS-REFERENCE TO RELATED APPLICATION(S)

This application claims benefit of priority to Korean Patent Application No. 10-2019-0168560 filed on Dec. 17, 2019 in the Korean Intellectual Property Office, the disclosure of which is incorporated by reference herein in its entirety.

BACKGROUND

Example embodiments of the present inventive concept relate to a semiconductor integrated circuit.

With the trend for reducing thicknesses and sizes of electronic products, there has been increasing demand for high integration density of a semiconductor device. As a semiconductor device has been designed to be downscaled, a height of a standard cell included in an integrated circuit has been decreased. In the case of an integrated circuit including a cross-coupled structure, to implement a standard cell having a reduced height, a layout for securing a process margin without violating a design rule, may be desirable.

SUMMARY

An example embodiment of the present inventive concept is to provide a semiconductor integrated circuit including a standard cell in which congestion of wiring layers is reduced.

According to an example embodiment of the present inventive concept, a semiconductor integrated circuit includes a substrate, and a standard cell on the substrate, wherein the standard cell includes first and second active regions extending in a first direction on the substrate and spaced apart from each other in a second direction perpendicular to the first direction, an isolation region disposed between the first and second active regions, a pair of gate lines extending parallel to each other in the second direction on opposite sides of the standard cell, spaced apart from each other in the first direction, overlapping the first and second active regions, a first gate pattern disposed between the pair of gate lines, and extending in the second direction on the first active region, a second gate pattern extending in the second direction on the second active region, and disposed along a first line extending in the second direction, a third gate pattern disposed between the pair of gate lines, spaced apart from the first gate pattern in the first direction on the first active region, and arranged to be parallel to the first gate pattern, a fourth gate pattern spaced apart from the second gate pattern in the first direction on the second active region, arranged to be parallel to the second gate pattern, and disposed along a second line extending in the second direction and spaced apart from the first line in the first direction, a gate cutting region disposed between the first gate pattern and the second gate pattern and between the third gate pattern and the fourth gate pattern on the isolation region, a common contact line extending in the second direction between the first and third gate patterns and the second and fourth gate patterns and overlapping the first and second active regions, a first wiring structure configured to electrically connect the first gate pattern to the fourth gate pattern, the first wiring structure including a first lower wiring layer extending in the first direction on the first active region and overlapping the first gate pattern on the first gate pattern, a second lower wiring layer extending in the first direction on the second active region and overlapping the fourth gate pattern on the fourth gate pattern, first and second intermediate wiring layers overlapping the first and second lower wiring layers on the first and second lower wiring layers, respectively, and extending in the second direction, and a first upper wiring layer overlapping the first and second intermediate wiring layers on the first and second intermediate wiring layers and extending in the first direction, a second wiring structure configured to electrically connect the second gate pattern to the third gate pattern, the second wiring structure including a third lower wiring layer extending in the first direction on the first active region and overlapping the third gate pattern on the third gate pattern, a fourth lower wiring layer extending in the first direction on the second active region and overlapping the second gate pattern on the second gate pattern, third and fourth intermediate wiring layers overlapping the third and fourth lower wiring layers on the third and fourth lower wiring layers, respectively, and extending in the second direction, and a second upper wiring layer overlapping the third and fourth intermediate wiring layers on the third and fourth intermediate wiring layers, and extending in the first direction, and a fifth lower wiring layer extending in the first direction on the isolation region and overlapping the common contact line on the common contact line.

According to an example embodiment of the present inventive concept, a semiconductor integrated circuit includes a substrate, and a standard cell on the substrate. The standard cell includes first and second active regions extending in parallel to each other in a first direction and spaced apart from each other in a second direction perpendicular to the first direction, an isolation region disposed between the first and second active regions, first and second gate lines extending in parallel to each other in the second direction to overlap the first and second active regions and the isolation region, and spaced apart from each other in the first direction, a common contact line extending in parallel to the first and second gate lines between the first and second gate lines, a gate cutting region crossing the first and second gate lines on the isolation region, dividing the first gate line into a first gate pattern on the first active region and a second gate pattern on the second active region, and dividing the second gate line into a third gate pattern on the first active region and a fourth gate pattern on the second active region, a first conductive line overlapping the first and third gate patterns and extending in the first direction, a second conductive line overlapping the second and fourth gate patterns and extending in the first direction, and a third conductive line extending in the first direction on the isolation region and overlapping the common contact line. The first conductive line has first and third lower wiring layers separated from each other, the first lower wiring layer overlaps the first gate pattern, and the third lower wiring layer overlaps the third gate pattern. The second conductive line has second and fourth lower wiring layers separated from each other, the second lower wiring layer overlaps the fourth gate pattern, and the fourth lower wiring layer overlaps the second gate pattern. The first gate pattern and the fourth gate pattern are electrically connected to each other through the first and second lower wiring layers, first and second intermediate wiring layers overlapping the first and second lower wiring layers, respectively, and extending in the second direction, and a first upper wiring layer overlapping the first and second intermediate wiring layers and extending in the first direction. The second gate pattern and the third gate pattern are electrically connected to each other through the third and fourth lower wiring layers, third and fourth intermediate wiring layers overlapping the third and fourth lower wiring layers, respectively, and extending in the second direction, and a second upper wiring layer overlapping the third and fourth intermediate wiring layers and extending in the first direction. The first to third conductive lines are parallel to one another. Each of the first to fourth lower wiring layers, the first to fourth intermediate wiring layers, and the first and second upper wiring layers has a bar shape or a line shape having a unidirectional structure.

According to an example embodiment of the present inventive concept, a semiconductor integrated circuit includes a substrate, and a standard cell on the substrate. The standard cell includes first and second active regions extending in a first direction and spaced apart from each other in a second direction perpendicular to the first direction, an isolation region disposed between the first and second active regions, a plurality of source/drain regions spaced apart from each other in the first direction on the first and second active regions, a plurality of semiconductor layers stacked and spaced apart from each other in a third direction perpendicular to the first direction and the second direction between the plurality of source/drain regions, a pair of gate lines extending parallel to each other in the second direction on opposite sides of the standard cell, wherein the pair of gate lines are spaced apart from each other in the first direction and overlap the first and second active regions, first and second gate lines disposed between the pair of gate lines, extending in parallel to each other in the second direction on the first and second active regions and the isolation region, and spaced apart from each other in the first direction, where the first and second gate lines surround the plurality of semiconductor layers on the first and second active regions, respectively, a common contact line disposed between the first and second gate lines, extending in parallel to the first and second gate lines on the first and second active regions and the isolation region, and overlapping the plurality of source/drain regions on the first and second active regions, a gate cutting region crossing the first and second gate lines on the isolation region, dividing the first gate line into a first gate pattern on the first active region and a second gate pattern on the second active region, and dividing the second gate line into a third gate pattern on the first active region and a fourth gate pattern on the second active region, a first conductive line overlapping the first and third gate patterns and extending in the first direction, a second conductive line overlapping the second and fourth gate patterns and extending in the first direction, and a third conductive line overlapping the common contact line on the isolation region and extending in the first direction. The first conductive line has first and third lower wiring layers separated from each other, the first lower wiring layer overlaps the first gate pattern, and the third lower wiring layer overlaps the third gate pattern. The second conductive line has second and fourth lower wiring layers separated from each other, the second lower wiring layer overlaps the fourth gate pattern, and the fourth lower wiring layer overlaps the second gate pattern. The first gate pattern and the fourth gate pattern are electrically connected to each other through the first and second lower wiring layers, first and second intermediate wiring layers overlapping the first and second lower wiring layers, respectively, and extending in the second direction, and a first upper wiring layer overlapping the first and second intermediate wiring layers and extending in the first direction. The second gate pattern and the third gate pattern are electrically connected to each other through the third and fourth lower wiring layers, third and fourth intermediate wiring layers overlapping the third and fourth lower wiring layers, respectively, and extending in the second direction, and a second upper wiring layer overlapping the third and fourth intermediate wiring layers and extending in the first direction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
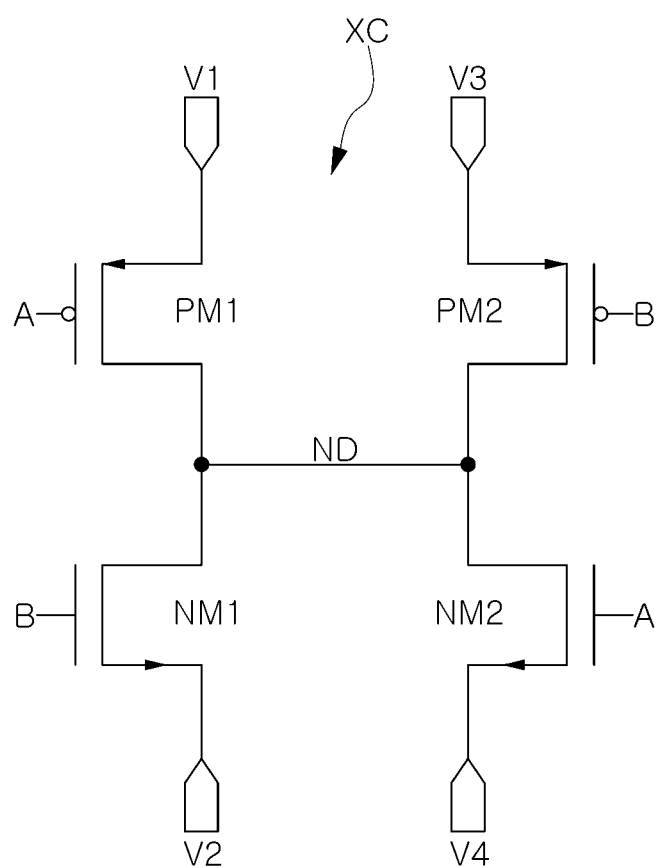
FIG. 1 is a circuit diagram illustrating an example of a cross-coupled structure of a semiconductor integrated circuit according to an example embodiment of the present inventive concept.

FIG. 1 is a circuit diagram illustrating an example of a cross-coupled structure of a semiconductor integrated circuit according to an example embodiment.

Referring to FIG. 1, a cross-coupled structure XC may include a first p-type metal-oxide-semiconductor (PMOS)

transistor PM1 and a first n-type metal-oxide-semiconductor (NMOS) transistor NM1 connected to each other in series, and a second PMOS transistor PM2 and a second NMOS transistor NM2 connected to each other in series. The cross-coupled structure XC in the example embodiment may be included in various standard cells that refer to a group of transistors and interconnect structures that provide a Boolean logic function (e.g., AND, OR, XOR, XNOR, inverters), a storage function (flipflop or latch) or a more complex function. In an example embodiment, the standard cells may include, for example, sequential logic cells such as a latch, a flip-flop, or the like, or combinational logic cells including a multiplexer, an adder, or the like.

The first PMOS transistor PM1 may have a source connected to a first voltage terminal V1, a gate for receiving a first control signal A, and a drain connected to an output node ND. The first NMOS transistor may have a drain connected to an output node ND, a gate for receiving a second control signal B, and a source connected to a second voltage terminal V2. The second PMOS transistor may have a source connected to a third voltage terminal V3, a gate for receiving the second control signal B, and a drain connected to the output node ND. The second NMOS transistor NM2 may have a drain connected to the output node ND, a gate for receiving the first control signal A, and a source connected to a fourth voltage terminal V4.

The gates of the first PMOS transistor PM1 and the second NMOS transistor NM2 may be electrically connected to each other and may receive the first control signal A. The gates of the first NMOS transistor NM1 and the second PMOS transistor PM2 may be electrically connected to each other and may receive the second control signal B. Accordingly, the first and second PMOS transistors PM1 and PM2 and the first and second NMOS transistors NM1 and NM2 may be included in the cross-coupled structure XC.

Figure 2:
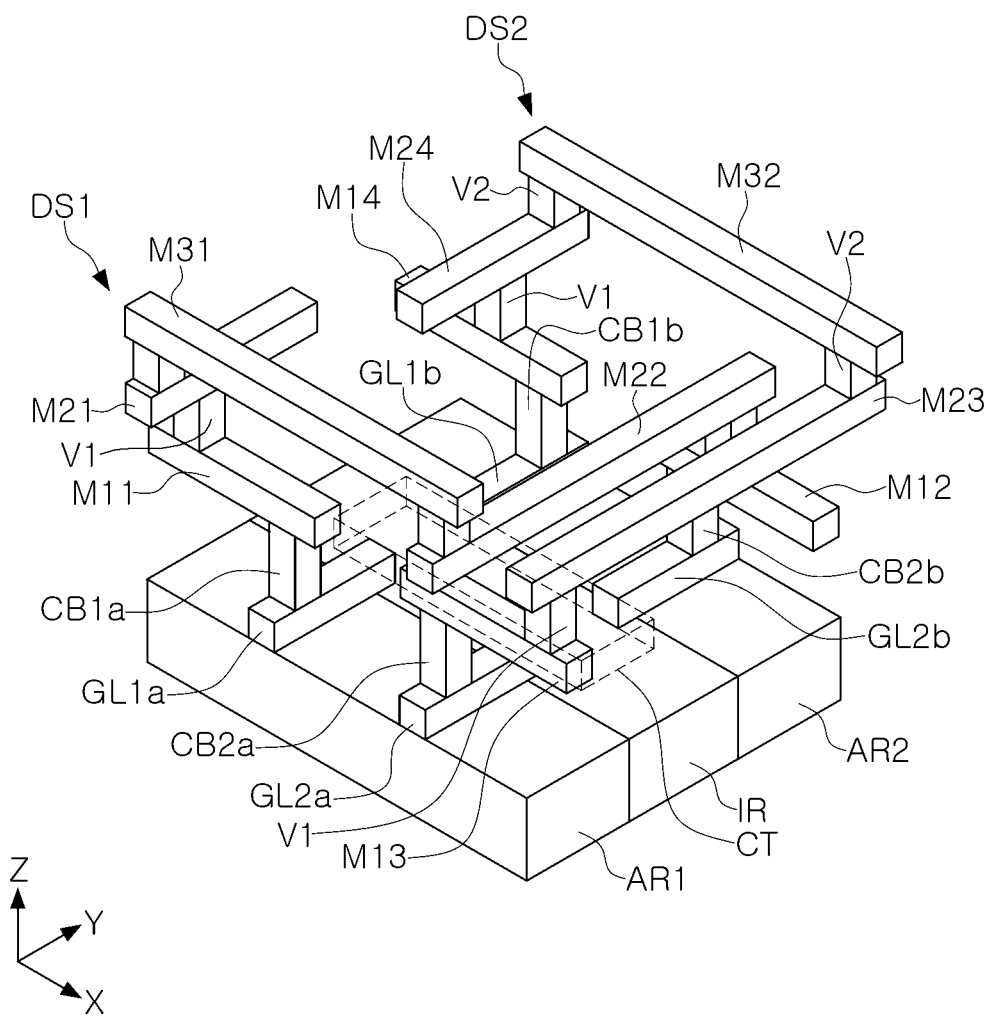
FIG. 2 is a perspective diagram illustrating a portion of a standard cell corresponding to the cross-coupled structure illustrated in FIG. 1 according to an example embodiment of the present inventive concept.
Figure 3:
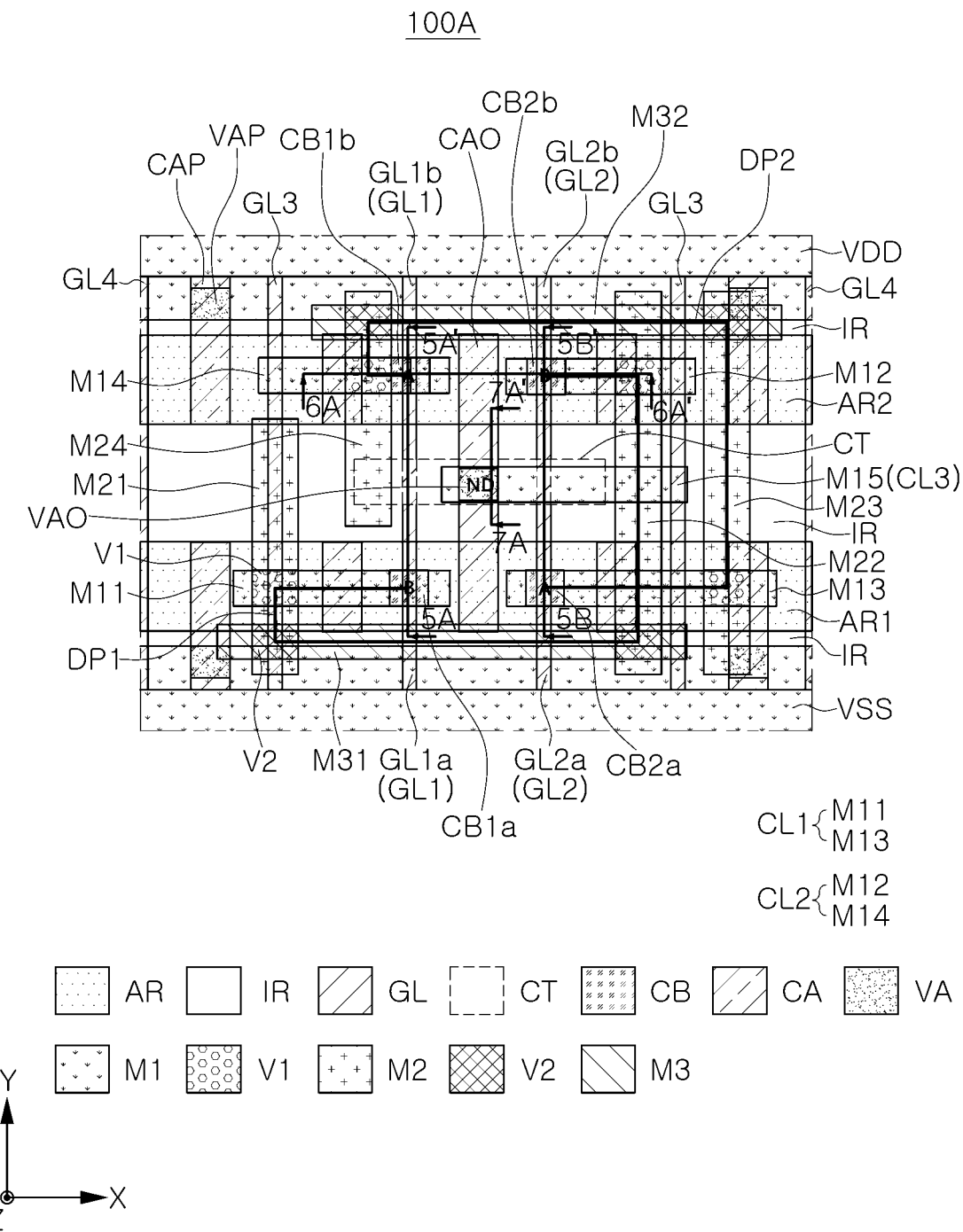
FIG. 3 is a diagram illustrating a layout of a portion of a standard cell according to an example embodiment of the present inventive concept.

FIG. 2 is a perspective diagram illustrating a portion of a standard cell corresponding to the cross-coupled structure illustrated in FIG. 1 according to an example embodiment. To illustrate first and second wiring structures, a common contact line CA0, an output via VA0, and a power wiring layer VSS and VDD in the layout illustrated in FIG. 3 are not illustrated in FIG. 2. The common contact line CA0, the output via VA0, and the power wiring layer VSS and VDD may be described later with reference to FIGS. 3 and 4A to 4C, 5A, 5B and 6.

Referring to FIG. 2, a standard cell in the example embodiment may include first and second active regions AR1 and AR2, first and second gate lines GL1 and GL2, a gate cutting region CT, first to fourth gate contacts CB1a, CB1b, CB2a, and CB2b, and first and second wiring structures DS1 and DS2.

The first and second active regions AR1 and AR2 may extend in a first direction X, and may be disposed to be parallel to each other in a second direction Y, substantially perpendicular to the first direction X. The first active region AR1 and the second active region AR2 may be spaced apart from each other in the second direction Y and may have different conductivity-types. The first and second active regions AR1 and AR2 may be referred to as diffusion regions. Also, a region between the first active region AR1 and the second active region AR2 may be referred to as an isolation region IR or a dummy region DR.

The first and second gate lines GL1 and GL2 may extend in the second direction Y across the first and second active regions AR1 and AR2, and may be disposed to be parallel to each other in the first direction X. The first and second gate lines GL1 and GL2 may correspond to gate electrodes of a semiconductor device. The first and second gate lines GL1 and GL2 may be spaced apart from each other by a constant gap.

The gate cutting region CT may cross the first and second gate lines GL1 and GL2 on the isolation region IR. The gate cutting region CT may cut out a partial region of the first and second gate lines GL1 and GL2. Each of the first and second gate lines GL1 and GL2 may be divided into two elements by the gate cutting region CT. The gate cutting region CT may cross the first gate line GL1 and may divide the first gate line GL1 into a first gate pattern GL1a and a second gate pattern GL1b. The gate cutting region CT may also cross the second gate line GL2 and may divide the second gate line GL2 into a third gate pattern GL2a and a fourth gate pattern GL2b. The gate cutting region CT may extend in the first direction X. The gate cutting region CT may have a sufficient length to cut out both the first and second gate lines GL1 and GL2 in the first direction X.

The first to fourth gate contacts CB1a, CB1b, CB2a, and CB2b may overlap the first active region AR1 or the second active region AR2. For example, the first gate contact CB1a (or referred to as a first lower gate contact) on the first active region AR1 may overlap the first gate pattern GL1a, and the second gate contact CB1b (or referred to as a first upper gate contact) on the second active region AR2 may overlap the second gate pattern GL1b. The third gate contact CB2a (or referred to as a second lower gate contact) on the first active region AR1 may overlap the third gate pattern GL2a, and the fourth gate contact CB2b (or referred to as a second upper gate contact) on the second active region AR2 may overlap the fourth gate pattern GL2b. The first to fourth gate contacts CB1a, CB1b, CB2a, and CB2b may be referred to as gate contact patterns of gate contact plugs.

A second control signal B may be applied to the first gate pattern GL1a and the fourth gate pattern GL2b through the first and fourth gate contacts CB1a and CB2b. A first control signal A may be applied to the second gate pattern GL1b and the third gate pattern GL2a through the second and third gate contacts CB1b and CB2a.

In an example embodiment, the first gate contact CB1a and the third gate contact CB2a may be disposed along the same linear line, and the second gate contact CB1b and the fourth gate contact CB2b may be disposed along the same linear line. For example, the first gate contact CB1a and the third gate contact CB2a may be disposed on the first active region AR1 and spaced apart from each other in the first direction X, and the second gate contact CB1b and the fourth gate contact CB2b may be disposed on the second active region AR2 and spaced apart from each other in the first direction X.

In an example embodiment, the term "along a linear line" indicates that two elements may be substantially disposed along the same linear (i.e., straight) line extending in the first direction X or the second direction Y, and that one element is not shifted in a diagonal direction with respect to the other element. For example, the first gate contact CB1a and the third gate contact CB2a may be disposed along a linear line extending in the first direction X, and the third gate contact CB2a is not disposed in a diagonal direction with respect to the first gate contact CB1a. As the first and third gate contacts CB1a and CB2a are disposed along a first linear line extending in the first direction X and the second and fourth gate contacts CB2a and CB2b are disposed along a second linear line extending in the second direction Y and spaced apart from the first linear line in the first direction X, congestion of lower wiring layers M1 disposed on the first to fourth gate contacts CB1a, CB1b, CB2a, and CB2b may be reduced.

In example embodiments, the first to fourth gate contacts CB1a, CB1b, CB2a, and CB2b may be spaced apart from one another in the first direction X or the second direction Y in island shapes, and a vertical cross-sectional surface of each of the first to fourth gate contacts CB1a, CB1b, CB2a, and CB2b may have a rectangular shape, a square shape, a trapezoidal shape, or the like. A width of each of the first to fourth gate contacts CB1a, CB1b, CB2a, and CB2b in the first direction X may be equal to or less than a spacing distance between the gate lines GL1 and GL2. Also, the width of each of the first to fourth gate contacts CB1a, CB1b, CB2a, and CB2b may be greater than or the same as a width of each of the first and second gate lines GL1 and GL2 in the first direction X.

The first lower and second upper gate contacts CB1a and CB2b may be electrically connected to each other by a first wiring structure DS1, and the first upper and second lower gate contacts CB1b and CB2a may be electrically connected to each other by a second wiring structure DS2. Accordingly, a second control signal B may be transferred to the first gate pattern GL1a and the fourth gate pattern GL2b by the first wiring structure DS1. Also, the first control signal A may be transferred to the second gate pattern GL1b and the third gate pattern GL2a by the second wiring structure DS2. The first and second wiring structures DS1 and DS2 may be spaced apart from each other.

The first and second wiring structures DS1 and DS2 may include a multi-level interconnect including lower wiring layers M11, M12, M13, and M14 (hereinafter, denoted by M1) each having a unidirectional structure, intermediate wiring layers M21, M22, M23, and M24 (denoted by M2) each having a unidirectional structure, upper wiring layers M31 and M32 (denoted by M3) each having a unidirectional structure, a lower contact via V1 connecting the lower wiring layers M1 to the intermediate wiring layers M2, and an intermediate contact via V2 connecting the intermediate wiring layers M2 to the upper wiring layers M3. FIG. 3 shows a three-level interconnect, but the present invention is not limited thereto. In an example embodiment, the multi-level interconnect may be a two-level interconnect or at least four-level interconnect.

The term "unidirectional structure" indicates that each of the plurality of wiring layers disposed on the same level extends in the same extending direction in a bar shape or a line shape. For example, the lower wiring layer M1 may be disposed on a level higher than a level of upper surfaces of the first and second gate lines GL1 and GL2, and may extend in the first direction X. The intermediate wiring layer M2 may be disposed on a level higher than an upper surface of the lower wiring layer M1 and may extend in the second direction Y. The upper wiring layer M3 may be disposed on a level higher than an upper surface of the intermediate wiring layer M2 and may extend in the first direction X. The first direction X and the second direction Y may be perpendicular to each other, but an example embodiment thereof is not limited thereto.

The lower wiring layer M1 may include first to fifth lower wiring layers M11, M12, M13, M14, and M15 disposed on substantially the same level. For the simplicity of drawings, the fifth lower wiring layer M15, which is present in FIG. 5, is omitted in FIG. 2. The first and third lower wiring layers M11 and M13 may overlap the first active region AR1, the second and fourth lower wiring layers M12 and M14 may overlap the second active region AR2, and the fifth lower wiring layer M15 may overlap the isolation region IR.

The intermediate wiring layer M2 may include first to fourth intermediate wiring layers M21, M22, M23, and M24 disposed on substantially the same level. The intermediate wiring layer M2 may be disposed on a level higher than a level of the lower wiring layer M1. The intermediate wiring layer M2 may overlap the lower wiring layer M1. The intermediate wiring layer M2 may overlap at least one of the first active region AR1 and the second active region AR2. For example, the first intermediate wiring layer M21 and the fourth intermediate wiring layer M24 may overlap the first active region AR1 and the second active region AR2, respectively. The second intermediate wiring layer M22 and the third intermediate wiring layer M23 may overlap both the first active region AR1 and the second active region AR2. The second intermediate wiring layer M22 and the third intermediate wiring layer M23 may have lengths greater than those of the first intermediate wiring layer M21 and the fourth intermediate wiring layer M24.

The upper wiring layer M3 may include first and second upper wiring layers M31 and M32 disposed on substantially the same level. The upper wiring layer M3 may be disposed on a level higher than a level of the intermediate wiring layer M2. The upper wiring layer M3 may overlap the intermediate wiring layer M2. At least a portion of the upper wiring layer M3 may be disposed beyond the first active region AR1 and the second active region AR2.

For example, the first wiring structure DS1 may include the first lower wiring layer M11 extending in the first direction X and overlapping the first gate pattern GL1a on the first gate pattern GL1a, the first intermediate wiring layer M21 extending in the second direction Y and overlapping the first lower wiring layer M11 on the first lower wiring layer M11, the first upper wiring layer M31 extending in the first direction X and overlapping the first intermediate wiring layer M21 on the first intermediate wiring layer M21, the second intermediate wiring layer M22 extending in the second direction Y and overlapping the first upper wiring layer M31 below the first upper wiring layer M31, and the second lower wiring layer M12 extending in the first direction X and overlapping the fourth gate pattern GL2b on the fourth gate pattern GL2b. The first wiring structure DS1 may further include a lower contact via V1 disposed between the first lower wiring layer M11 and the first intermediate wiring layer M21 and between the second lower wiring layer M12 and the second intermediate wiring layer M22 and electronically connecting the above-mentioned elements to each other, and an intermediate contact via V2 disposed between the first upper wiring layer M31 and the first intermediate wiring layer M21 and between the first upper wiring layer M31 and the second intermediate wiring layer M22 and electronically connecting the above-mentioned elements to each other.

For example, the second wiring structure DS2 may include the fourth lower wiring layer M14 extending in the first direction X and overlapping the second gate pattern GL1b on the second gate pattern GL1b, the fourth intermediate wiring layer M24 extending in the second direction Y and overlapping the fourth lower wiring layer M14 on the fourth lower wiring layer M14, the second upper wiring layer M32 extending in the first direction X and overlapping the fourth intermediate wiring layer M24 on the fourth intermediate wiring layer M24, the third intermediate wiring layer M23 extending in the second direction Y and overlapping the second upper wiring layer M32 below the second upper wiring layer M32, and the third lower wiring layer M13 extending in the first direction X and overlapping the third gate pattern GL2a on the third gate pattern GL2a. The second wiring structure DS2 may further include a lower contact via V1 disposed between the third lower wiring layer M13 and the third intermediate wiring layer M23 and between the fourth lower wiring layer M14 and the fourth intermediate wiring layer M24 and electronically connecting the above-mentioned elements to each other and an intermediate contact via V2 disposed between the second upper wiring layer M32 and the fourth intermediate wiring layer M24 and between the second upper wiring layer M32 and the third intermediate wiring layer M23 and electronically connecting the above-mentioned elements to each other.

The first gate contact CB1a may be disposed on the same line as the third gate contact CB2a. The first lower wiring layer M11 overlapping the first gate contact CB1a on the first gate contact CB1a may be disposed on the same line as the third lower wiring layer M13 overlapping the third gate contact CB2a on the third gate contact CB2a. The second gate contact CB1b may be disposed on the same line as the fourth gate contact CB2b. The fourth lower wiring layer M14 overlapping the second gate contact CB1b on the second gate contact CB1b may be disposed on the same line as the second lower wiring layer M12 overlapping the fourth gate contact CB2b on the fourth gate contact CB2b. A first cutting region CUT1 (in FIG. 4B) separating the first lower wiring layer M11 from the third lower wiring layer M13 may be disposed between an end of the first lower wiring layer M11 and an end of the third lower wiring layer M13, and a second cutting region CUT2 (in FIG. 4B) separating the fourth lower wiring layer M14 from the second lower wiring layer M12 may be disposed between an end of the fourth lower wiring layer M14 and an end of the second lower wiring layer M12. For the simplicity of drawings, the first and second cutting regions CUT1 and CUT2 are omitted in FIG. 2.

Accordingly, by reducing the number of lower wiring layers connected to the fourth gate contacts CB1a, CB1b, CB2a, and CB2b, congestion of the lower wiring layers may be reduced. Also, a region for forming additional lower wiring layers, in addition to the lower wiring layers connected to the fourth gate contacts CB1a, CB1b, CB2a, and CB2b, may be secured.

Figure 4A:
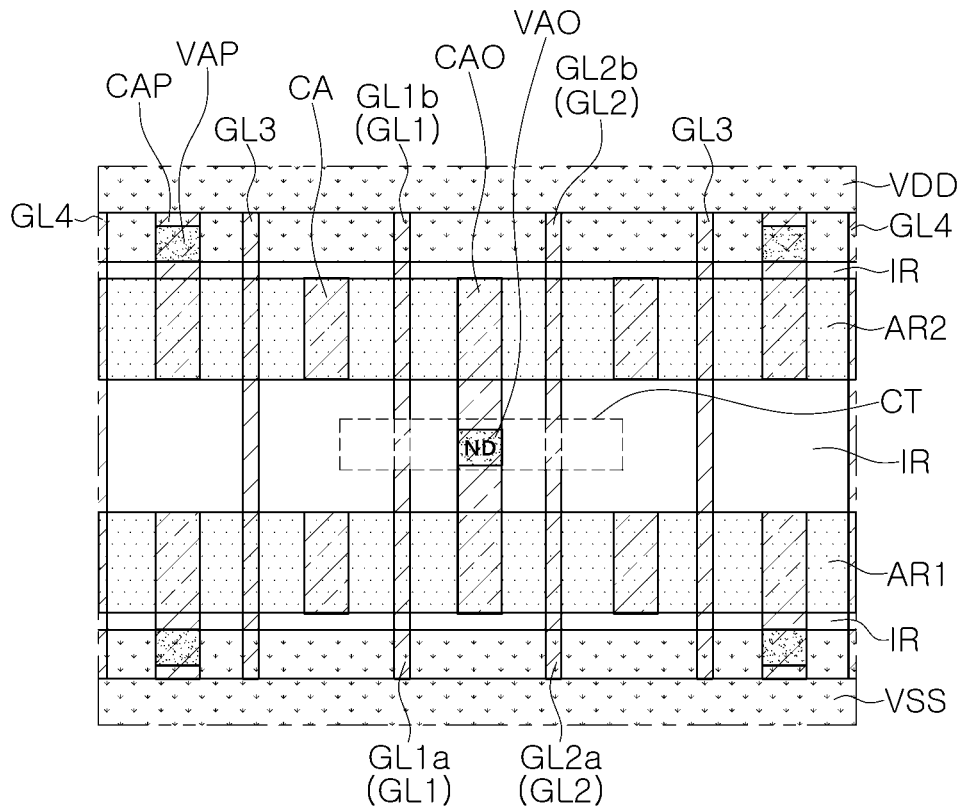
FIGS. 4A to 4C are diagrams illustrating a portion of the layout illustrated in FIG. 3.
Figure 4A:
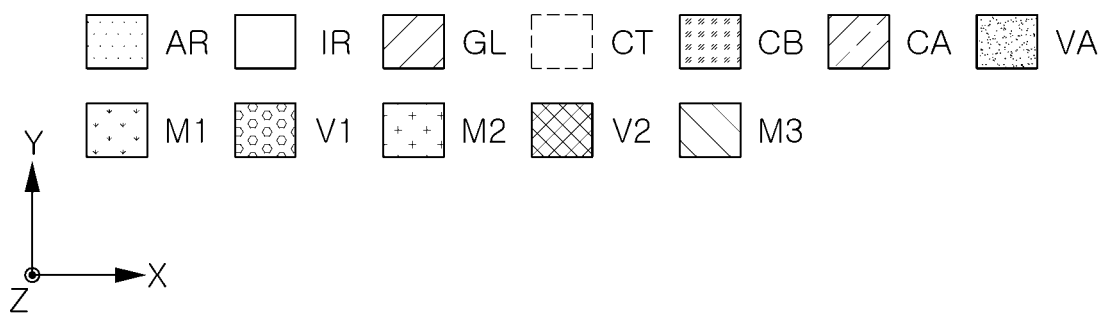
Figure 4B:
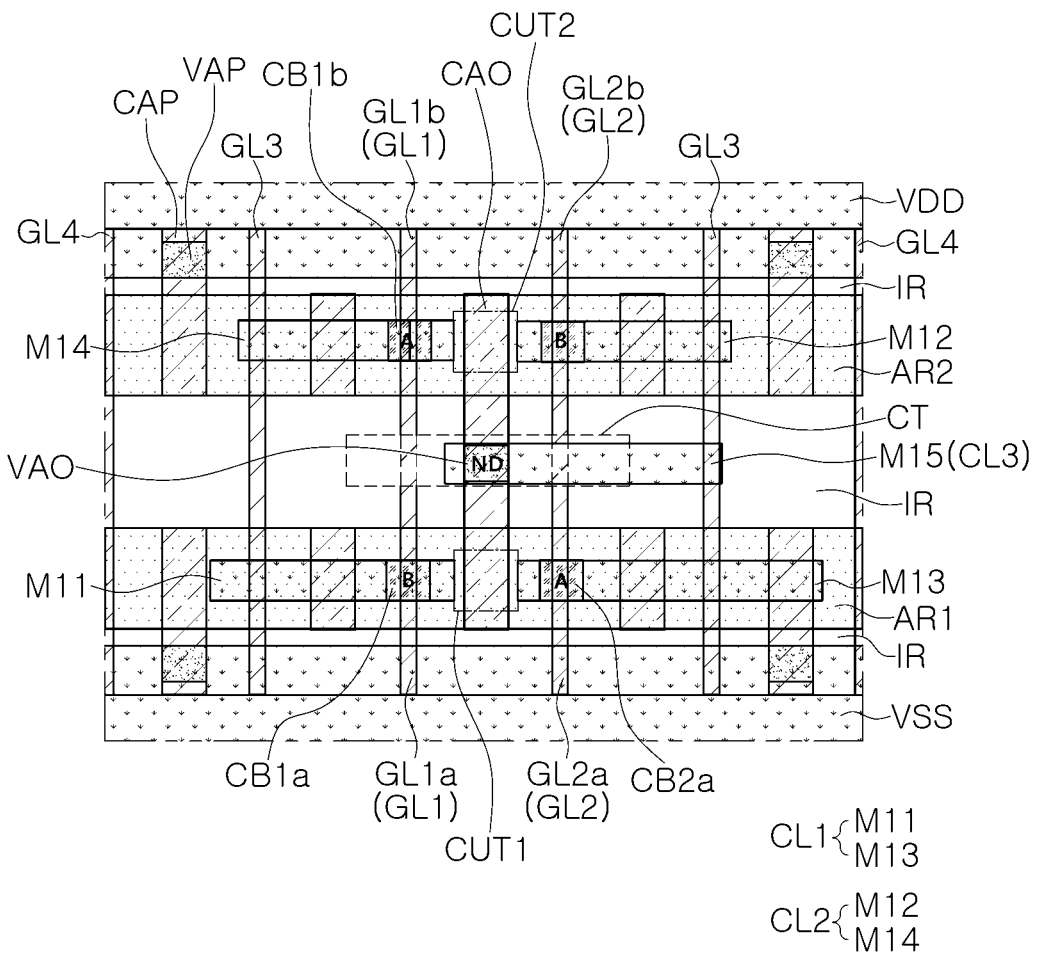
Figure 4C:
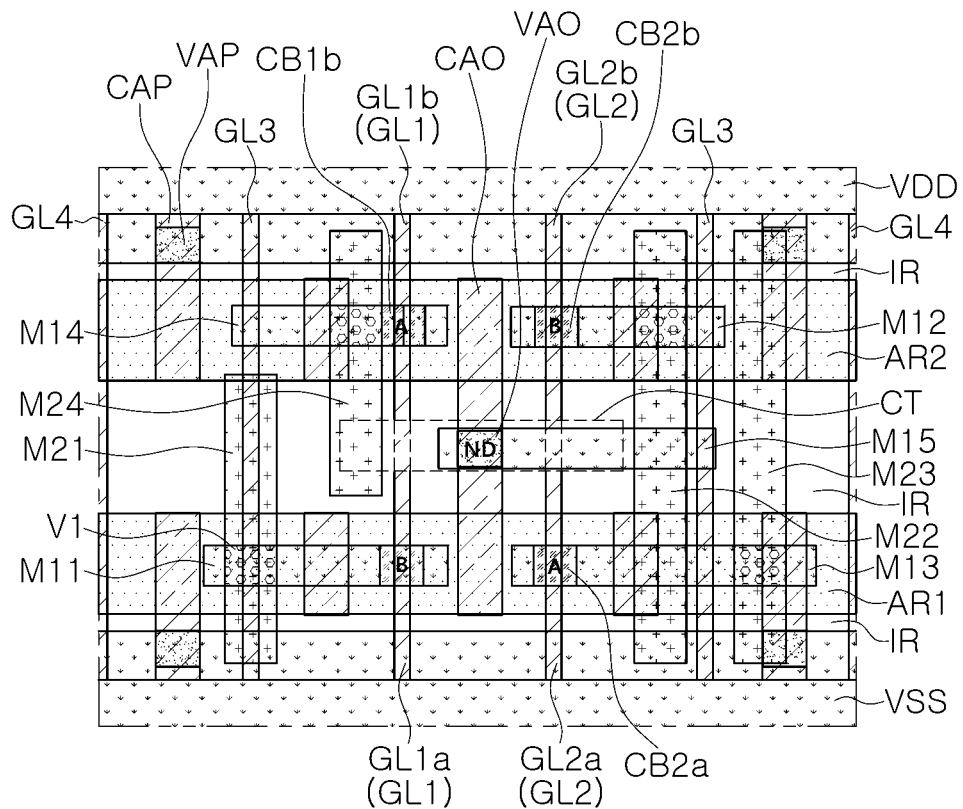
Figure 4C:
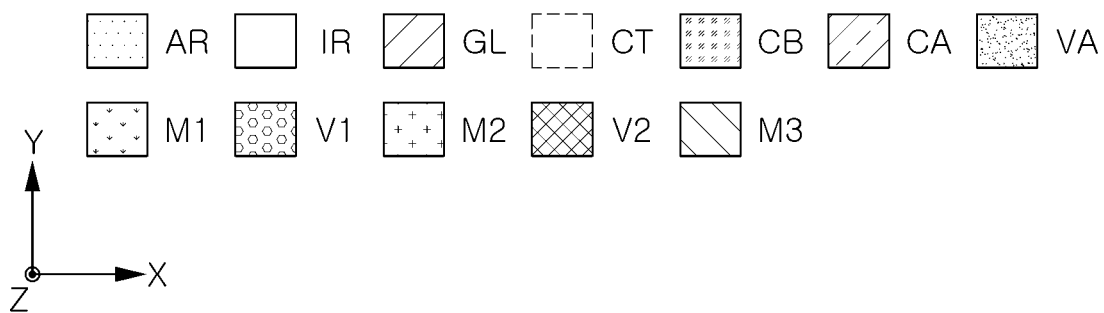

FIG. 3 is a diagram illustrating a layout of a portion of a standard cell 100A according to an example embodiment. FIGS. 4A to 4C are diagrams illustrating a layout of a portion of the standard cell 100A illustrated in FIG. 3. The descriptions overlapping the descriptions described with reference to FIG. 2 will not be repeated.

Referring to FIGS. 3 and 4A to 4C, a semiconductor integrated circuit in the example embodiment may include a substrate and a standard cell on the substrate. The standard cell 100A in the example embodiment may include first and second active regions AR1 and AR2, a pair of fourth gate lines GL4, a pair of third gate lines GL3, a first gate pattern GL1a, a second gate pattern GL1b, a third gate pattern GL2a, a fourth gate pattern GL2b, a gate cutting region CT and a common contact line CAO. The first and second active regions AR1 and AR2 may have different conductivity-types, extending in parallel to each other in the first direction X, and spaced apart from each other in the second direction Y. The isolation region IR may be disposed between the first and second active regions AR1 and AR2. The pair of fourth gate lines GL4 extending in parallel in the second direction Y may be disposed on opposite sides of the standard cell 100A and spaced apart from each other in the first direction X and may overlap the first and second active regions AR1 and AR2. For simplicity of drawings, the pair of fourth gate lines GL4 are partially shown in FIGS. 4 and 4A to 4C. In an example embodiment, a width of each of the pair of third gate lines GL3 may be the same as that of each of the pair of third gate lines GL3. The pair of third gate lines GL3 extending in parallel in the second direction Y may be disposed within the standard cell 100A and spaced apart from each other in the first direction X and may overlap the first and second active regions AR1 and AR2. The first gate pattern GL1a may be disposed between the pair of gate lines GL4 and extending in the second direction Y on the first active region AR1. The second gate pattern GL1b may extend in the second direction Y on the second active region AR2 and disposed on the same line as the first gate pattern GL1a in the second direction Y. The first gate pattern GL1a and the second gate pattern GL1b may be referred to as a first gate line GL1. The first gate line GL1 may be disposed between the pair of third gate lines GL3. The third gate pattern GL2a may be disposed between the pair of gate lines GL4, may be spaced apart from the first gate pattern GL1a in the first direction X on the first active region AR1, and may extend in parallel to the first gate pattern GL1a. The fourth gate pattern GL2b may be spaced apart from the second gate pattern GL1b in the first direction X on the second active region AR2, may extend in parallel to the second gate pattern GL1b, and may be disposed on the same line as the third gate pattern GL2a in the second direction Y. The third gate pattern GL2a and the fourth gate pattern GL2b may be referred to as a second gate line GL2. The first gate line GL2 may be disposed between the pair of third gate lines GL3. The gate cutting region CT may separate the first gate pattern GL1a from the second gate pattern GL1b on the isolation region IR. The gate cutting region CT may further separate the third gate pattern GL2a from the fourth gate pattern GL2b on the isolation region IR. The common contact line CAO extending in the second direction Y may be disposed between the first and third gate patterns GL1a and GL2a and between the second and fourth gate patterns GL1b and GL2b. The common contact line CAO may cross the first and second active regions AR1 and AR2. The gate cutting region CT may overlap the common contact line CAO without separation. The standard cell 100A may further include a first wiring structure DS1 (in FIG. 2) electrically connecting the first gate pattern GL1a to the fourth gate pattern GL2b, and a second wiring structure DS2 (in FIG. 2) electrically connecting the second gate pattern GL1b to the third gate pattern GL2a. The first wiring structure DS1 (in FIG. 2) may include a first lower wiring layer M11 extending in the first direction X on the first active region AR1 and overlapping the first gate pattern GL1a on the first gate pattern GL1a, a second lower wiring layer M12 extending in the first direction X on the second active region AR2 and overlapping the fourth gate pattern GL2b on the fourth gate pattern GL2b, first and second intermediate wiring layers M21 and M22 overlapping the first lower wiring layer M11 and the second lower wiring layer M12, respectively, and extending in the second direction Y, and a first upper wiring layer M31 overlapping the first and second intermediate wiring layers M21 and M22 and extending in the first direction X. In an example embodiment, the second intermediate wiring layer M22 may be electrically connected to the second lower wiring layer M12 via a lower contact via V1, but no contact via is present in an overlapped region between the second intermediate wiring layer M22 and the third lower wiring layer M13 for electrical connection. The second wiring structure DS2 (in FIG. 2) may include a third lower wiring layer M13 extending in the first direction X on the first active region AR1 and overlapping the third gate pattern GL2a on the third gate pattern GL2a, a fourth lower wiring layer M14 extending in the first direction X on the second active region AR2 and overlapping the second gate pattern GL1b on the second gate pattern GL1b, third and fourth intermediate wiring layers M23 and M24 overlapping the third lower wiring layer M13 and the fourth lower wiring layer M14, respectively, and extending in the second direction Y, and a second upper wiring layer M32 overlapping the third and fourth intermediate wiring layers M23 and M24 on the third and fourth intermediate wiring layers M23 and M24, and extending in the first direction X. In an example embodiment, the third intermediate wiring layer M23 may be electrically connected to the third lower wiring layer M13 via a lower contact via V1, but no lower contact via is present in an overlapped region between the third intermediate wiring layer M23 and the second lower wiring layer M12 for electrical connection. The standard cell 100A may further include a fifth lower wiring layer M15 extending in the first direction X on the isolation region IR and overlapping the common contact line CAO on the common contact line CAO, and the fifth lower wiring layer M15 may be disposed to be parallel to the first to fourth lower wiring layers M11, M12, M13, and M14. For the simplicity of drawings, the first upper wiring layer M31 and the second upper wiring layer M32 are omitted from FIGS. 4A to 4C.

The standard cell 100A may further include an output via VAO disposed between the common contact line CAO and the fifth lower wiring layer M15 and electrically connecting the common contact line CAO to the fifth lower wiring layer M15, and the output via VAO may overlap the isolation region IR in a third direction Z perpendicular to the first direction X and the second direction Y. Accordingly, the first and second active regions AR1 and AR2 may be connected to an output node ND through the common contact line CAO and the output via VAO.

The standard cell 100A may further include an active contact CA (in FIG. 4A) extending in the second direction Y on the first active region AR1 or the second active region AR2, and power wiring layers VSS and VDD disposed on an upper side and a lower side of the standard cell 100A, respectively, without overlapping the first active region AR1 and the second active region AR2, and extending in the first direction X. The active contact CA may include an active contact pad CAP extending to overlap the power wiring layers VSS and VDD, and the active contact pad CAP may be electrically connected to the power wiring layers VSS and VDD by an active contact via VAP.

In the standard cell 100A, the third and fourth gate lines GL3 and GL4 may be configured as gate lines provided for the other elements included in the other standard cell. The fourth gate line GL4 may be configured as a pair of gate lines extending in the second direction Y on both ends of the standard cell 100A spaced apart from each other in the first direction X, overlapping the first and second active regions AR1 and AR2, and configured (i.e., arranged) to be parallel to each other. In the standard cell 100A, first to third gate lines GL1, GL2, and GL3 may be disposed between the pair of gate lines GL4. In an example embodiment, the pair of gate lines GL4 may be configured as dummy lines in the standard cell, but they may serve as gate lines for a standard cell or a circuit block adjacent to the standard cell 100A. The first to third gate lines GL1, GL2, and GL3 may include gate electrodes. As used herein, the term "dummy" is used to refer to a component that has the same or similar structure and shape as other components but does not have a substantial function and exists only as a pattern in a standard cell.

For example, the standard cell 100A may include the pair of gate lines GL4 extending in the second direction Y, overlapping the first and second active regions AR1 and AR2, and configured to be parallel to each other. The first to fourth gate patterns GL1a, GL1b, GL2a, and GL2b may be disposed between the pair of gate lines GL4. The pair of gate lines GL4 and the first to fourth gate patterns GL1a, GL1b, GL2a, and GL2b may include portions disposed on the same level.

The first wiring structure DS1 (in FIG. 2) may include a first lower wiring layer M11 extending in the first direction X and overlapping the first gate pattern GL1a on the first gate pattern GL1a, a first intermediate wiring layer M21 extending in the second direction Y and overlapping the first lower wiring layer M11 on the first lower wiring layer M11, a first upper wiring layer M31 extending in the first direction X and overlapping the first intermediate wiring layer M21 on the first intermediate wiring layer M21, a second intermediate wiring layer M22 extending in the second direction Y and overlapping the first upper wiring layer M31 below the first upper wiring layer M31, and a second lower wiring layer M12 extending in the first direction X and overlapping the second intermediate wiring layer M22 below the second intermediate wiring layer M22. The second lower wiring layer M12 may overlap the fourth gate pattern GL2b on the fourth gate pattern GL2b. Also, lower contact vias V1 disposed between the first lower wiring layer M11 and the first intermediate wiring layer M21 and between the second lower wiring layer M12 and the second intermediate wiring layer M22, and intermediate contact vias V2 disposed between the first upper wiring layer M31 and the first intermediate wiring layer M21 and between the first upper wiring layer M31 and the second intermediate wiring layer M22 may be further included.

Accordingly, a first electrical path of the first wiring structure DS1 may be formed from the first gate pattern GL1a to the first lower wiring layer M11 connected by a first gate contact CB1a, the first intermediate wiring layer M21 connected to the first lower wiring M11 by the lower contact via V1, the first upper wiring layer M31 connected to the first intermediate wiring layer M21 by the intermediate contact via V2, the second intermediate wiring layer M22 connected to the first upper wiring layer M31 by the intermediate contact via V2, the second lower wiring layer M12 connected to the second intermediate wiring layer M22 by the lower contact via V1, and the fourth gate pattern GL2b connected to the second lower wiring layer M12 by the fourth gate contact CB2b, and a second control signal B may be transmitted along the first electrical path.

The second wiring structure DS2 (in FIG. 2) may include a fourth lower wiring layer M14 extending in the first direction X and overlapping the second gate pattern GL1b on the second gate pattern GL1b, a fourth intermediate wiring layer M24 extending in the second direction Y and overlapping the fourth lower wiring layer M14 on the fourth lower wiring layer M14, a second upper wiring layer M32 extending in the first direction X and overlapping the fourth intermediate wiring layer M24 on the fourth intermediate wiring layer M24, a third intermediate wiring layer M23 extending in the second direction Y and overlapping the second upper wiring layer M32 below the second upper wiring layer M32, and a third lower wiring layer M13 extending in the first direction X and overlapping the third intermediate wiring layer M23 below the third intermediate wiring layer M23. The third lower wiring layer M13 may overlap the third gate pattern GL2a on the third gate pattern GL2a. Also, lower contact vias V1 disposed between the fourth lower wiring layer M14 and the fourth intermediate wiring layer M24 and between the third lower wiring layer M13 and the third intermediate wiring layer M23, and intermediate contact vias V2 disposed between the second upper wiring layer M32 and the third intermediate wiring layer M23 and between the second upper wiring layer M32 and the fourth intermediate wiring layer M24 may further be included.

Accordingly, a second electrical path of the second wiring structure DS2 may be formed from the second gate pattern GL1b to the fourth lower wiring layer M14 connected to the second gate pattern GL1b by the second gate contact CB1b, the fourth intermediate wiring layer M24 connected to the fourth lower wiring layer M14 by the lower contact via V1, the second upper wiring layer M32 connected to the fourth intermediate wiring layer M24 by the intermediate contact via V2, the third intermediate wiring layer M23 connected to the second upper wiring layer M32 by the intermediate contact via V2, the third lower wiring layer M13 connected to the third intermediate wiring layer M23 by the lower contact via V1, and the third gate pattern GL2a connected to the third lower wiring layer M13 by the third gate contact CB2a, and a first control signal A may be transmitted along the electrical path DP2.

The first to fifth lower wiring layers M11, M12, M13, M14, and M15 may extend in parallel to one another along three lines. For example, a first conductive line CL1 may include the first lower wiring layer M11 and the third lower wiring layer M13 separated by a first cutting region CUT1 disposed between the first gate pattern GL1a and the third gate pattern GL2a. The first lower wiring layer M11 and the third lower wiring layer M13 may extend in the first direction X to overlap the first gate pattern GL1a and the third gate pattern GL2a on the first active region AR1, respectively. A second conductive line CL2 may include the second lower wiring layer M12 and the fourth lower wiring layer M14 separated by a second cutting region CUT2 disposed between the second gate pattern GL1b and the fourth gate pattern GL2b. The second lower wiring layer M12 and the fourth lower wiring layer M14 may extend in the first direction X to overlap the second gate pattern GL1b and the fourth gate pattern GL2b on the second active region AR2, respectively. A third conductive line CL3 may extend in the first direction X to overlap the common contact line CAO on the isolation region IR. The first lower wiring layer M11 and the third lower wiring layer M13 may overlap the first active region AR1, the fourth lower wiring layer M14 and the second lower wiring layer M12 may overlap the second active region AR2, and the fifth lower wiring layer M15 may overlap the isolation region. Also, the first lower wiring layer M11 and the third lower wiring layer M13 may be disposed along the same linear line in the first direction X, and the fourth lower wiring layer M14 and the second lower wiring layer M12 may be disposed on the same line in the first direction X. Accordingly, a first cutting region CUT1 (in FIG. 4B) disposed between an end of the first lower wiring layer M11 and an end of the third lower wiring layer M13 and a second cutting region CUT2 (in FIG. 4B) disposed between an end of the fourth lower wiring layer M14 and an end of the second lower wiring layer M12 may be formed.

The lower contact via V1 may be disposed in a position in which a lower wiring layer M1 extending in the first direction X overlaps (or intersect with, on an X-Y plane) an intermediate wiring layer M2 extending in the second direction Y, and may be configured as an island type, for example. The lower contact via V1 may have a rectangular surface in a top down view. The lower contact via V1 may be disposed on the first and second active regions AR1 and AR2. In an example embodiment, corners of the lower contact via V1 may be rounded. The present inventive concept is not limited thereto. In an example embodiment, the lower contact via V1 may be a square surface with rounded corners in a top down view. In an example embodiment, the lower contact via V1 may be a circular shape or an elliptical shape.

The first to fourth intermediate wiring layers M21, M22, M23, and M24 may have different lengths (a length extending in the Y direction). For example, the fourth intermediate wiring layer M24 and the first intermediate wiring layer M21 may have lengths shorter than the second intermediate wiring layer M22 and the third intermediate wiring layer M23 and may overlap the second active region AR2 and the first active region AR1, respectively, in the third direction Z perpendicular to the first direction X and the second direction Y, and the third intermediate wiring layer M23 and the fourth intermediate wiring layer M24 may overlap the first active region AR1 and the second active region AR2 in the third direction Z. At least the first intermediate wiring layer M21 and the fourth intermediate wiring layer M24 do not overlap one of the first active region AR1 and the second active region AR2 in the third direction Z.

In an example embodiment, the fourth intermediate wiring layer M24 which does not overlap one of the first active region AR1 may be configured as a landing pad which may form a vertical electrical connection path between the second upper wiring layer M32 and the fourth lower wiring layer M14. In this case, at least a portion of the second upper wiring layer M32 and the fourth lower wiring layer M14 may overlap each other in the third direction.

The intermediate contact via V2 may be disposed at a position in which the intermediate wiring layer M2 extending in the second direction Y overlaps (or intersects with, on an X-Y plane) the upper wiring layer M3 extending in the first direction X, and may be configured as an island type, for example. The intermediate contact via V2 may have a rectangular vertical cross-sectional surface. The intermediate contact via V2 may overlap one of the first and second active regions AR1 and AR2. For example, the intermediate contact via V2 disposed between the second upper wiring layer M32 and the fourth intermediate wiring layer M24 and the intermediate contact via V2 disposed between the second upper wiring layer M32 and the third intermediate wiring layer M23 may overlap the second active region AR2. The intermediate contact via V2 disposed between the first upper wiring layer M31 and the first intermediate wiring layer M21 and the intermediate contact via V2 disposed between the first upper wiring layer M31 and the second intermediate wiring layer M22 may overlap the first active region AR1.

A common contact line or a common contact pad CAO may be disposed in the first active region AR1 between the first and second gate lines GL1 and GL2, and the common contact pad CAO may extend in the second direction Y and may extend to the second active region AR2 disposed between the first and second gate lines GL1 and GL2. For example, the common contact line CAO may connect the first active region AR1 and the second active region AR2 to each other without using additional conductive layers such as the lower wiring layer M1, the intermediate wiring layer M2 and the upper wiring layer M3.

Generally, as the lower wiring layer M1 is repeatedly disposed with a constant width and a constant gap, it may be beneficial to reduce the number of the lower wiring layers M1 (the number of tracks of the lower wiring layer M1) included in the standard cell in relation to the scaling of a size of a standard cell (e.g., the scaling of a height of a standard cell).

The standard cell 100A in the example embodiment may form a cut-line in lines CL1 and CL2 of the three lines CL1, CL2, and CL3 disposed adjacent to the power wiring layers VSS and VDD such that the standard cell 100A may include the first to fifth lower wiring layers M11, M12, M13, M14, and M15 spaced apart from one another along the three lines and extending in parallel to each other. Accordingly, congestion of the lower wiring layers may be reduced such that a size of the standard cell may be reduced, and a region for forming additional lower wiring layers may be secured.

The fifth lower wiring layer M15 for the output node ND may be connected to the common contact line CAO and may overlap the isolation region IR. Accordingly, a cross-coupled structure having a reduced cell height may be implemented by the lower wiring layers M1 having reduced tracks.

Also, as the gate cutting region CT is sufficiently spaced apart from the first to fourth lower wiring layers M11, M12, M13, and M14, a process margin for forming the gate contacts CB1a, CB1b, CB2a, and CB2b may be secured.

Figure 5A:
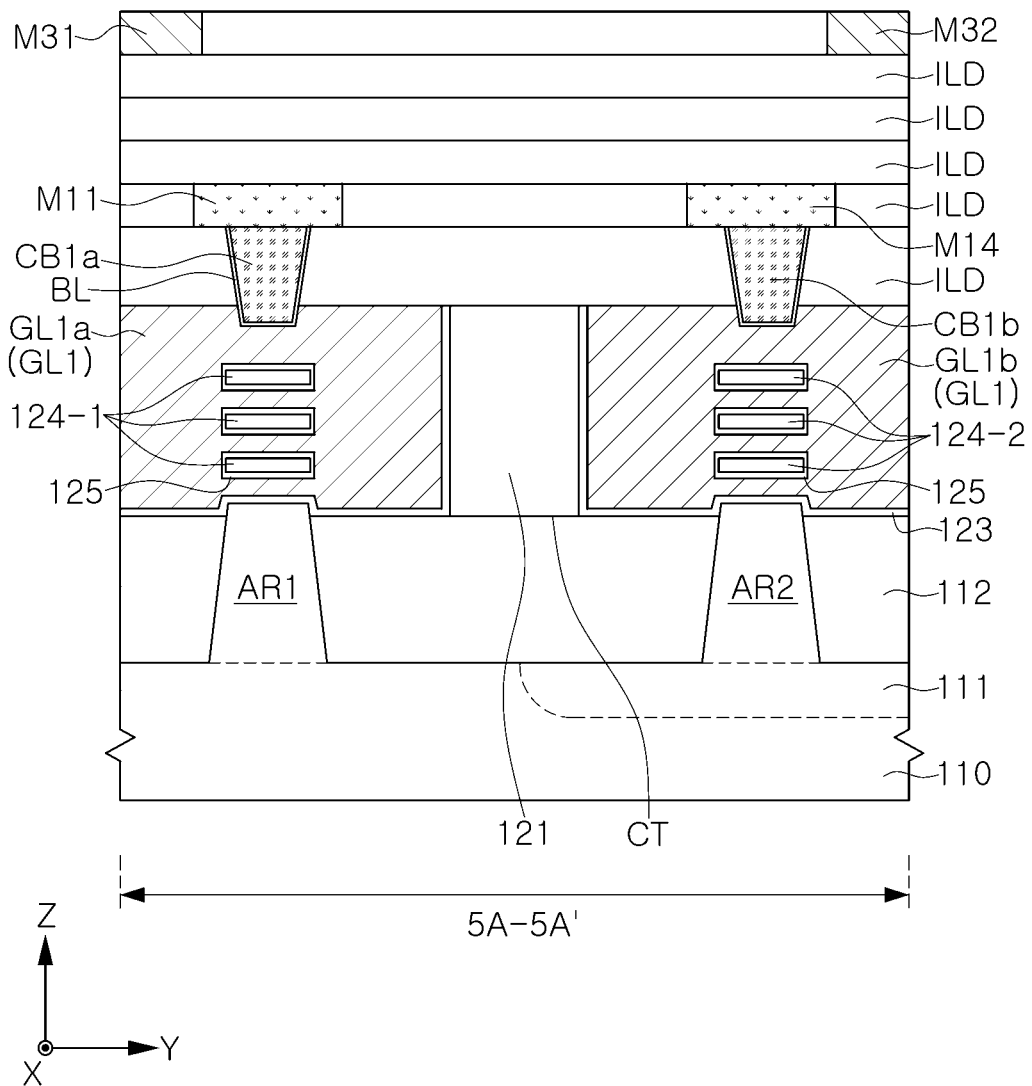
FIGS. 5A and 5B are cross-sectional diagrams along lines 5A-5A' and 5B-5B' in FIG. 3, respectively.
Figure 5B:
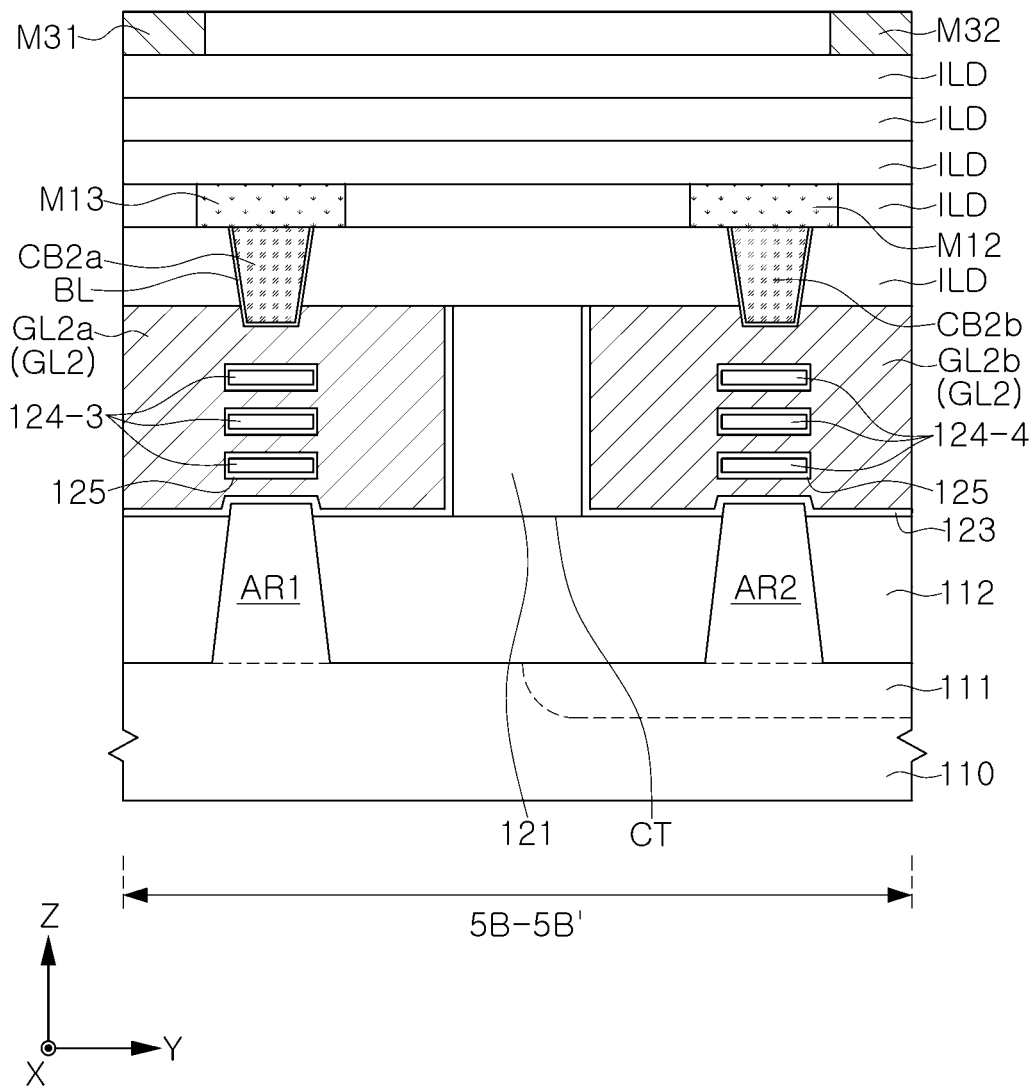
Figure 6:
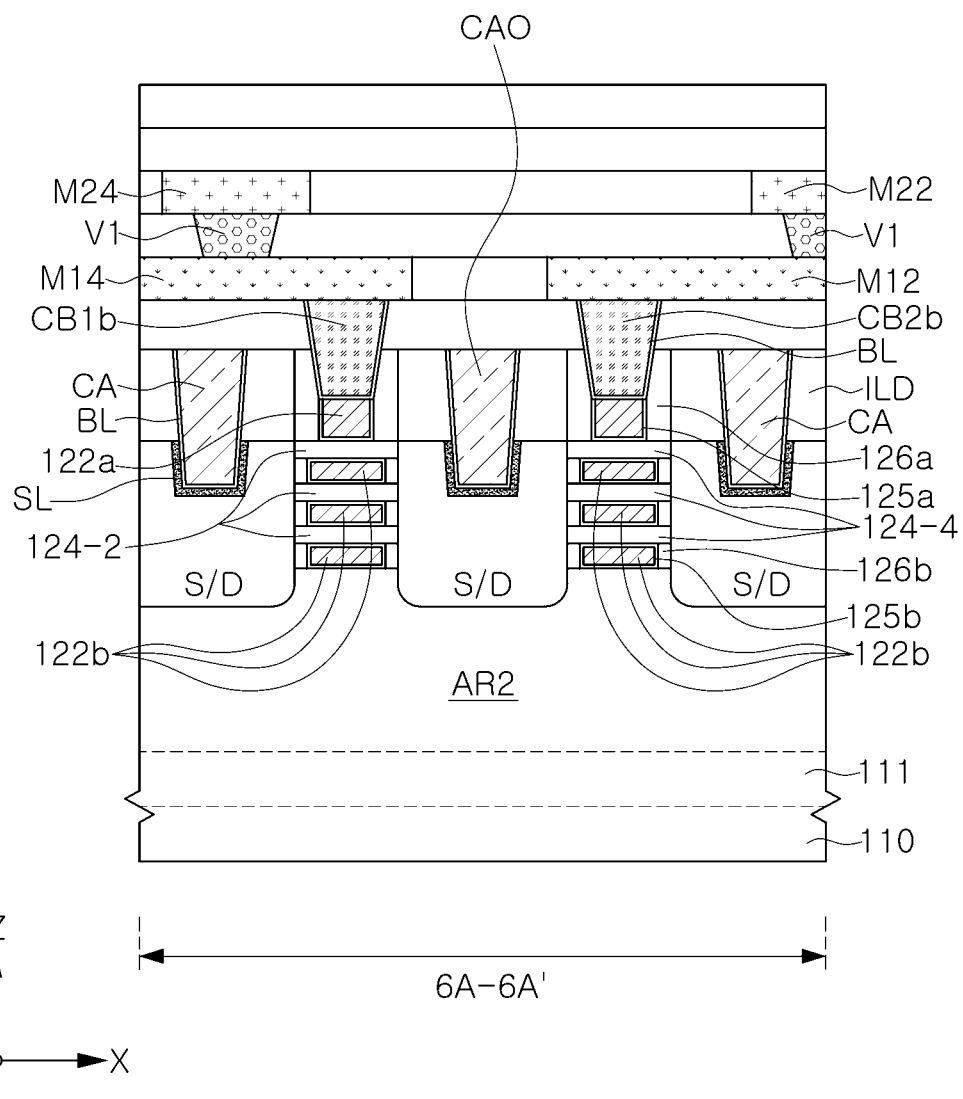
FIG. 6 is a cross-sectional diagram taken along line 6A-6A' in FIG. 3.
Figure 7:
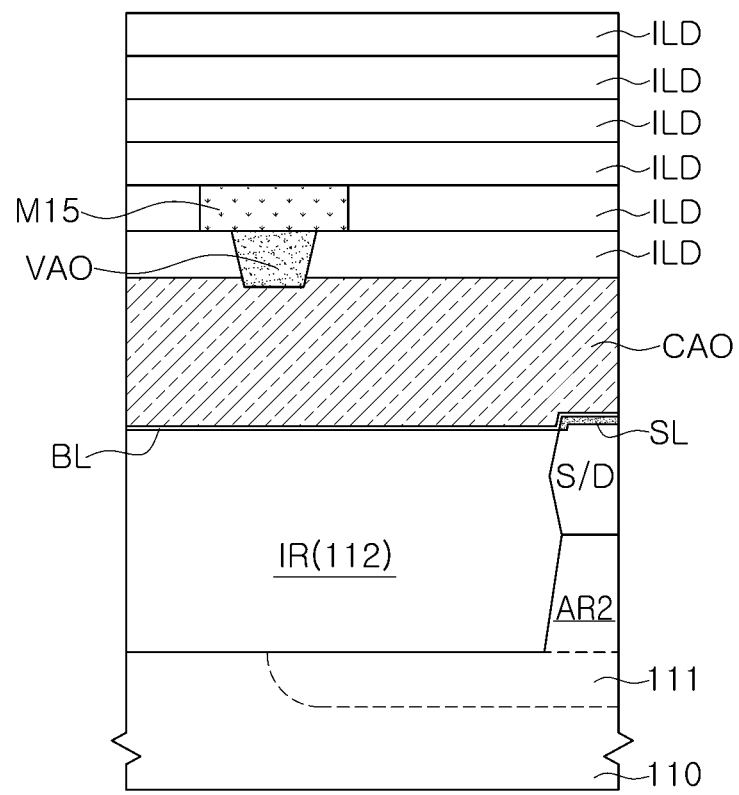
FIG. 7 is a cross-sectional diagram taken along line 7A-7A' in FIG. 3.

FIGS. 5A and 5B are cross-sectional diagrams along lines 5A-5A' and 5B-5B' in FIG. 3, respectively. FIG. 6 is a cross-sectional diagram taken along line 6A-6A' in FIG. 3. FIG. 7 is a cross-sectional diagram taken along line 7A-7A' in FIG. 3.

Referring to FIGS. 5 to 7 along with FIG. 3, the standard cell 100A may include a plurality of source/drain regions S/D spaced apart from each other in the first direction X on the first and second active regions AR1 and AR2, a plurality of semiconductor layers 124-1, 124-2, 124-3, and 124-4 stacked and spaced apart from each other in the third direction Z perpendicular to the first direction X and the second direction Y between the plurality of source/drain regions S/D, and an insulating spacer including a plurality of lower insulating spacers 126a and an upper insulating spacer 126b. The first and third gate patterns GL1a and GL2a may surround the plurality of semiconductor layers 124-1 and 124-3 on the first active region AR1, respectively, and may extend in the second direction Y, and the second and fourth gate patterns GL1b and GL2b may surround the plurality of semiconductor layers 124-2 and 124-4 on the second active region AR2, respectively, and may extend in the second direction Y. The first to fourth gate patterns GL1a, GL1b, GL2a, and GL2b may include a plurality of lower gate electrodes 122b covering lower portions of the plurality of semiconductor layers 124-1, 124-2, 124-3, and 124-4, respectively, and an upper gate electrode 122a covering an upper portion of an uppermost semiconductor layer of each of the plurality of semiconductor layers 124-1, 124-2, 124-3, and 124-4. However, a transistor of the standard cell in the example embodiment is not limited thereto. Accordingly, the semiconductor integrated circuit in example embodiments may include a fin-type transistor FinFET including a fin-type channel, a tunneling FET, a transistor including a nanowire, a transistor including a nanosheet (MBCFET® (Multi Bridge Channel FET)), or a three-dimensional (3D) transistor.

The first and second active regions AR1 and AR2 may have different conductivity-types on a substrate 110. For example, the first active region AR1 may be doped with P-type impurities, and the second active region AR2 may be doped with N-type impurities.

The substrate 110 may be configured as a semiconductor substrate. For example, the substrate 110 may include a semiconductor material such as Si or Ge, or a compound semiconductor material such as SiGe, SiC, GaAs, InAs, or InP. The substrate 110 may include a well doped with impurities, or a structure doped with impurities. For example, the substrate 110 may include an N-well 111 doped with N-type impurities. The second active region AR2 may be disposed on a portion of the N-well 111. A boundary between the second active region AR2 and the N-well 111 is illustrated to describe the elements, and a boundary therebetween may not be distinct.

The first and second active regions AR1 and AR2 and a device separation film 112 defining the first and second active regions AR1 and AR2 may be disposed on the substrate 110. An NMOS transistor (e.g., the elements NM1 and NM2 in FIG. 1) may be disposed on the first active region AR1, and a PMOS transistor (e.g., the elements PM1 and PM2 in FIG. 1) may be disposed on the second active region AR2, for example. The device separation film 112 may cover side walls of the first and second active regions AR1 and AR2. The device separation film 112 may be alternately disposed with the first and second active regions AR1 and AR2 in the second direction Y. The device separation film 112 may correspond to the isolation region IR illustrated in FIG. 3.

The first and third gate patterns GL1a and GL2a may cover an upper surface of the first active region AR1 and a portion of opposite side walls thereof. The second and fourth gate patterns GL1b and GL2b may cover an upper surface of the second active region AR2 and a portion of opposite side walls thereof. The first to fourth gate patterns GL1a, GL1b, GL2a and GL2b may cover an upper surface of the device separation film 112 disposed on opposite sides of the first and second active regions AR1 and AR2. The first to fourth gate patterns GL1a, GL1b, GL2a, and GL2b may correspond to the first and second gate lines GL1 and GL2 separated by the gate cutting region CT. For example, as illustrated in FIG. 5A, the first gate line GL1 may be divided into the first gate pattern GL1a and the second gate pattern GL1b by the gate cutting region CT. A space between the first gate pattern GL1a and the second gate pattern GL1b may be filled with a burying insulating layer 121 which serves as the gate cutting region CT. As illustrated in FIG. 5B, the second gate line GL2 may be divided into the third gate pattern GL2a and the fourth gate pattern GL2b, and a space between the third gate pattern GL2a and the fourth gate pattern GL2b may be filled with the burying insulating layer 121 which serves as the gate cutting region CT.

The first to fourth gate patterns GL1a, GL1b, GL2a, and GL2b may include a word function metal containing layer and a gap-fill metal film. The word function metal containing layer may include at least one metal selected from among Ti, W, Ru, Nb, Mo, Hf, Ni, Co, Pt, Yb, Tb, Dy, Er, and Pd. The gap-fill metal film may be formed of a W film or an Al film. For example, each of the first to fourth gate patterns GL1a, GL1b, GL2a, and GL2b may include a TiAlC/TiN/W stack structure, a TiN/TaN/TiAlC/TiN/W stack structure, or a TiN/TaN/TiN/TiAlC/TiN/W stack structure, but an example embodiment thereof is not limited thereto. The first to fourth gate patterns GL1a, GL1b, GL2a, and GL2b may be formed by a chemical vapor deposition (CVD) process or an atomic layer deposition (ALD) process.

A first gate insulating film 123 may be disposed among the first to fourth gate patterns GL1a, GL1b, GL2a, and GL2b, the first and second active regions AR1 and AR2, the device separation film 112, and the burying insulating layer 121 (see FIGS. 5A and 5B). The first gate insulating film 123 may be formed of a silicon oxide film, a high-k dielectric film, or a combination thereof. The high-k dielectric film may be formed of a material having a dielectric constant higher than that of a silicon oxide film. The high-k dielectric film may be formed of metal oxide or metal oxynitride. For example, the high-k dielectric film may be formed of a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, and combinations thereof, but an example embodiment thereof is not limited thereto. A second gate insulating film 125 may be disposed between the plurality of semiconductor layers 124-1, 124-2, 124-3, and 124-4 and the first to fourth gate patterns GL1a, GL1b, GL2a, and GL2b (see FIGS. 5A and 5B).

Each of the first to fourth gate patterns GL1a, GL1b, GL2a, and GL2b may include a plurality of lower gate electrodes 122b and an upper gate electrode 122a spaced apart from each other in the third direction Z on the first and second active regions AR1 and AR2. For example, referring to FIG. 6, the plurality of lower gate electrodes 122b separated from each other by the plurality of semiconductor layers 124-2 and 124-4 may be disposed on the second active region AR2, and the upper gate electrode 122a may be disposed on a level higher than a level of the plurality of lower gate electrodes 122b and may be in contact with gate contacts CB1b and CB2b. An upper surface, a lower surface, and opposite side surfaces of each of the plurality of lower gate electrodes 122b may be surrounded by a gate insulating film 125b, and a lower surface and opposite side surfaces of each of the upper gate electrode 122a may be surrounded by the gate insulating film 125a. The term "contact," as used herein, refers to a direct connection (i.e., touching) unless the context indicates otherwise.

Gate contacts CB1a, CB1b, CB2a, and CB2b may be disposed on the upper gate electrode 122a. For example, gate contacts (or gate contact plugs) CB1b and CB2b may be disposed on the upper gate electrode 122a. The gate contact plug may be formed of tungsten (W) or cobalt (Co). A barrier film BL may be disposed on side walls and bottom surfaces of the gate contacts CB1b and CB2b. The barrier film BL may be formed of Ti, Ta, TiN, TaN, or combinations thereof, for example.

The lower wiring layer M1 extending in the first direction X may be disposed on the gate contacts CB1a, CB1b, CB2a, and CB2b. The lower wiring layer M1 may include the first to fifth lower wiring layers M11, M12, M13, M14, and M15 described with reference to FIGS. 2 and 3. Also, power wiring layers VSS and VDD extending in the first direction X may be disposed on the same level as the lower wiring layer M1. A plurality of interlayer insulating films ILD may be disposed on the first wiring layer M1. The intermediate wiring layer M2 and the upper wiring layer M3 described with reference to FIG. 3 may be disposed on the plurality of interlayer insulating films ILD. A lower contact via V1 and an intermediate contact via V2 may penetrate the plurality of interlayer insulating films ILD to electrically connect the wiring layers M1, M2, and M3 to each other.

The plurality of source/drain regions S/D may be disposed on opposite sides of each of the plurality of lower gate electrodes 122b on the first and second active regions AR1 and AR2. For example, referring to FIG. 6, the plurality of lower gate electrodes 122b and the source/drain region S/D may be spaced apart from each other with the gate insulating films 125a and 125b and the insulating spacers 126a and 126b therebetween. The source/drain region S/D may include impurity ion implantation region disposed in a portion of the first and second active regions AR1 and AR2, a semiconductor epitaxial layer epitaxially grown from a plurality of recess regions disposed in the first and second active regions AR1 and AR2, or combinations thereof. The source/drain region S/D may include an epitaxially grown Si layer, an epitaxially grown SiC layer, or a plurality of epitaxially grown SiGe layers. For example, the transistor on the second active region AR2 may be a PMOS transistor, and the source/drain region S/D may include an epitaxially grown SiGe layer, and may include P-type impurities.

A lowermost interlayer insulating film of the plurality of interlayer insulating films ILD may be disposed on the source/drain region S/D, and an active contact CA may penetrate the lowermost interlayer insulating film toward the source/drain region S/D. In an example embodiment, the active contact CA may be electrically connected to the source/drain region S/D using a metal semiconductor film SL and a barrier film BL, for example. The active contact CA may extend in the second direction Y. The active contact CA may be formed of tungsten (W), cobalt (Co), nickel (Ni), tungsten silicide (WSix), cobalt silicide (CoSix), nickel silicide (Ni Six), or combinations thereof. The barrier film BL may be disposed on a side wall and a bottom surface of the active contact CA. The barrier film BL may be formed of Ti, Ta, TiN, TaN, or combinations thereof.

The common contact line CAO may be disposed on the source/drain region S/D of the plurality of source/drain regions S/D disposed among the first to fourth gate patterns GL1a, GL1b, GL2a, and GL2b. The common contact line CAO may extend in the second direction Y, and may overlap the first active region AR1, the second active region AR2, and the isolation region IR. The barrier film BL may be disposed on a side wall and a bottom surface of the common contact line CAO. The barrier film BL may be formed of Ti, Ta, TiN, TaN, or combinations thereof.

In FIG. 7, an active contact plug may be disposed on the common contact line CAO. The active contact plug may correspond to the output via VAO described with reference to FIGS. 3 and 4A to 4C.

The metal semiconductor film SL may be disposed between the active contact CA and the source/drain region S/D and between the common contact line CAO and the source/drain region S/D. For example, the metal semiconductor film SL may be disposed along a contact region in which the barrier film BL, disposed on a side wall and a bottom surface of each of the active contact CA and the common contact line CAO, is in contact with the source/drain region S/D. The metal semiconductor film SL may be formed of metal silicide, metal germanide, or metal silicide-germanide. The metal may include Ti, Ni, Ta, Co, W, or combinations thereof. The semiconductor may be Si, Ge, or SiGe.

The plurality of semiconductor layers 124-1, 124-2, 124-3, and 124-4 may include a plurality of first semiconductor layers 124-1 stacked and spaced apart from each other on the first active region AR1 and surrounded by the first gate pattern GL1a, a plurality of second semiconductor layers 124-2 stacked and spaced apart from each other on the second active region AR2 and surrounded by the second gate pattern GL1b, a plurality of third semiconductor layers 124-3 stacked and spaced apart from each other on the first active region AR1 and surrounded by the third gate pattern GL2a, and a plurality of fourth semiconductor layers 124-4 stacked and spaced apart from each other on the second active region AR2 and surrounded by the fourth gate pattern GL2b. The first gate pattern GL1a may surround each of the plurality of first semiconductor layers 124-1 and may extend in the second direction Y, the second gate pattern GL1b may surround each of the plurality of second semiconductor layers 124-2 and may extend in the second direction Y, the third gate pattern GL2a may surround each of the plurality of third semiconductor layers 124-3 and may extend in the second direction Y, and the fourth gate pattern GL2b may surround each of the plurality of fourth semiconductor layers 124-4 and may extend in the second direction Y.

The upper insulating spacer 126b may be disposed between the upper gate electrode 122a and the lowermost interlayer insulating film ILD. In an example embodiment, the upper insulating spacer 126b may be disposed on an upper surface of the uppermost semiconductor layer and a sidewall of the upper gate electrode 122a. Each of the lower insulating spacers 126a may disposed on a sidewall of a corresponding lower gate electrode of the plurality of lower gate electrodes 122b and between the sidewall of the corresponding lower gate electrode and the source/drain region S/D. The plurality of insulating spacers 126a and 126b may include a silicon nitride film, a SiOCN film, a SiCN film, or combinations thereof.

Figure 8:
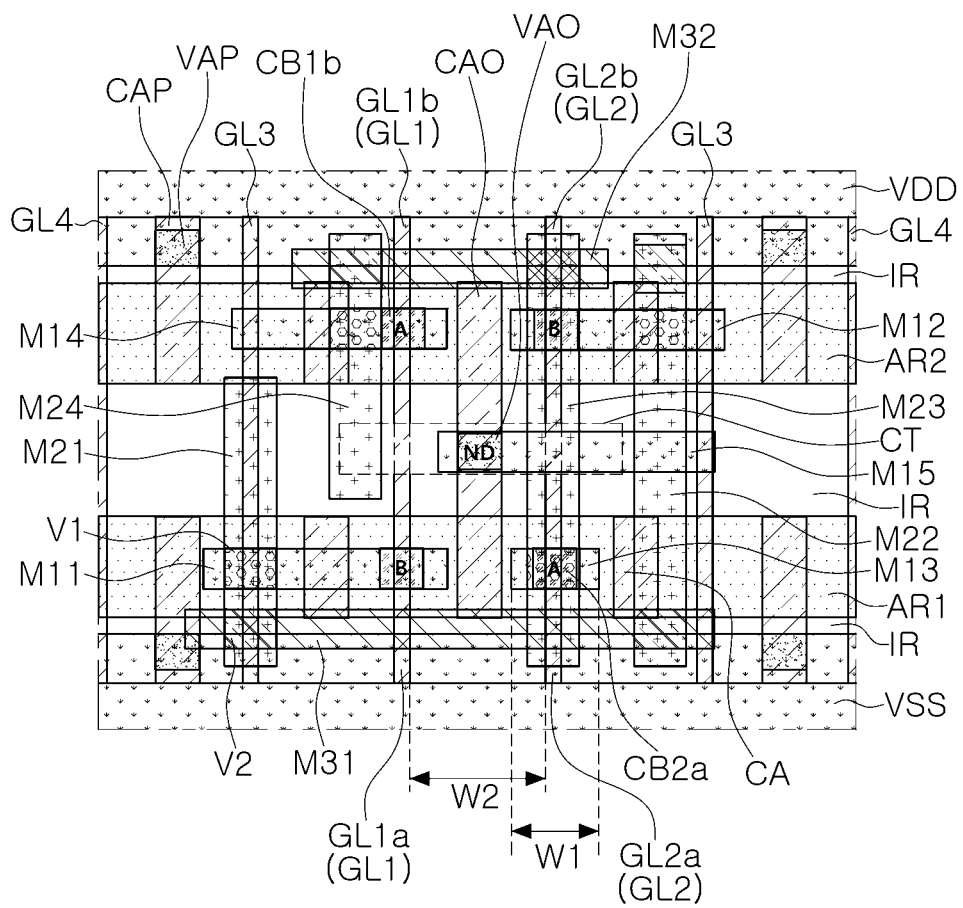
FIG. 8 is a diagram illustrating a layout of a portion of a standard cell according to another example embodiment of the present inventive concept.

FIG. 8 is a diagram illustrating a layout of a portion of a standard cell 100B according to another example embodiment. The descriptions overlapping the descriptions described with reference to FIGS. 2 and 3 will not be repeated.

Referring to FIG. 8, in a standard cell 100B in another example embodiment, a width W1 of at least a lower wiring layer M13 of first to fourth lower wiring layers M11, M12, M13, and M14 may be equal to or less than a spacing distance W2 between first and second gate lines GL1 and GL2. The width W1 and the spacing distance W2 may be measured in the first direction X1. An intermediate wiring layer M23 disposed on at least the lower wiring layer M13 of the first to fourth lower wiring layers M11, M12, M13, and M14 may overlap at least a gate pattern GL2a of first to fourth gate patterns GL1a, GL1b, GL2a, and GL2b. In an example embodiment, the intermediate wiring layer M23 may overlap the third gate pattern GL2a and the fourth gate pattern GL2b. The standard cell 100B may include a gate contact CB2a connecting at least the lower wiring layer M13 to the gate pattern GL2a of the first to fourth gate patterns GL1a, GL1b, GL2a, and GL2b, and a lower contact via V1 connecting the intermediate wiring layer M23 disposed on at least the lower wiring layer M13 to at least the lower wiring layer M13, and the gate contact CB2a may overlap the lower contact via V1 in the third direction Z. Accordingly, congestion of the lower wiring layer M1 and the intermediate wiring layer M2 may be reduced such that a size of an entire area of the cell may be reduced.

For example, the lower wiring layer M13 overlapping the third gate pattern GL2a on the first active region AR1 may have a width W1 smaller than a spacing distance W2 between the first and second gate lines GL1 and GL2. Also, the width W1 of the lower wiring layer M13 may be smaller than a spacing distance between a common contact line CA0 and an active contact CA. The common contact line CA0 and the active contact CA may be adjacent to opposite sides of the second gate line GL2, respectively. Accordingly, the lower wiring layer M13 does not overlap the common contact line CA0 and the active contact CA. Also, the intermediate wiring layer M23 overlapping the lower wiring layer M13 on the lower wiring layer M13 may overlap the third gate pattern GL2a in the third direction Z. Also, the third gate contact CB2a electrically connecting the third gate pattern GL2a to the third lower wiring layer M13 may be disposed between the third gate pattern GL2a and the lower wiring layer M13 and may overlap the lower contact via V1 electrically connecting the third lower wiring layer M13 to the intermediate wiring layer M23 between the third lower wiring layer M13 and the intermediate wiring layer M23 in the third direction.

Figure 9:
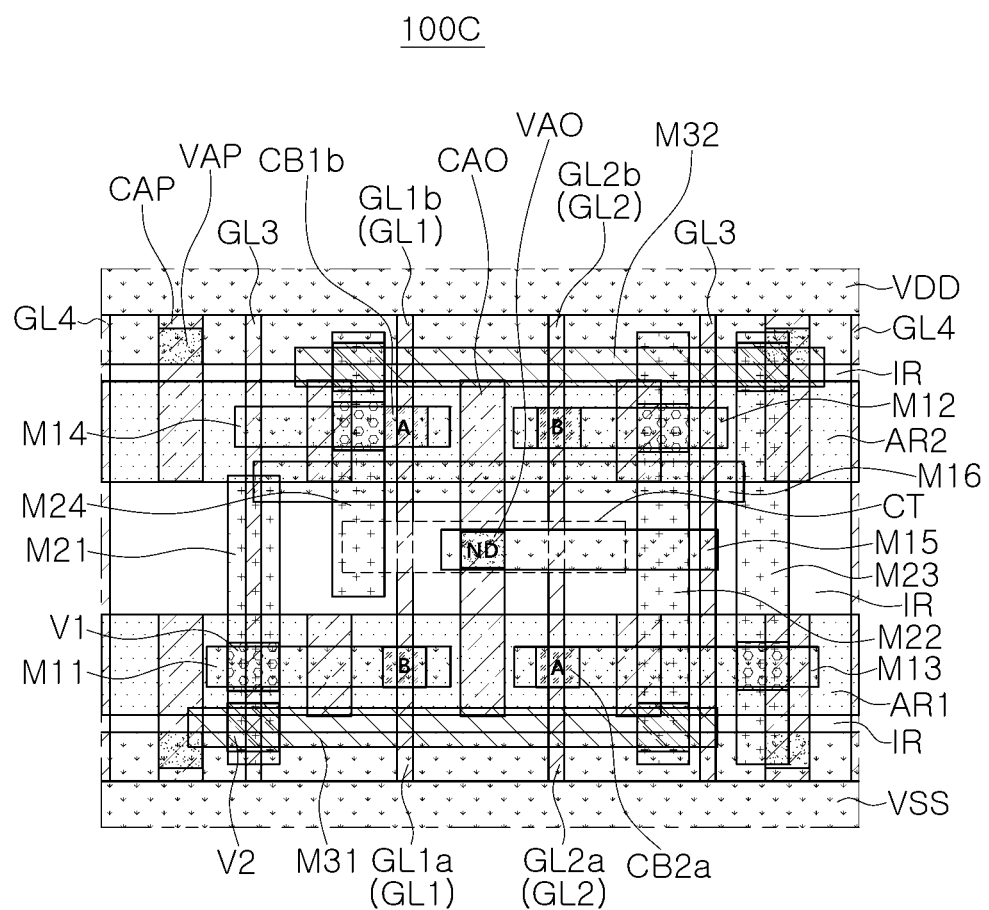
FIG. 9 is a diagram illustrating a layout of a portion of a standard cell according to another example embodiment of the present inventive concept.
Figure 9:
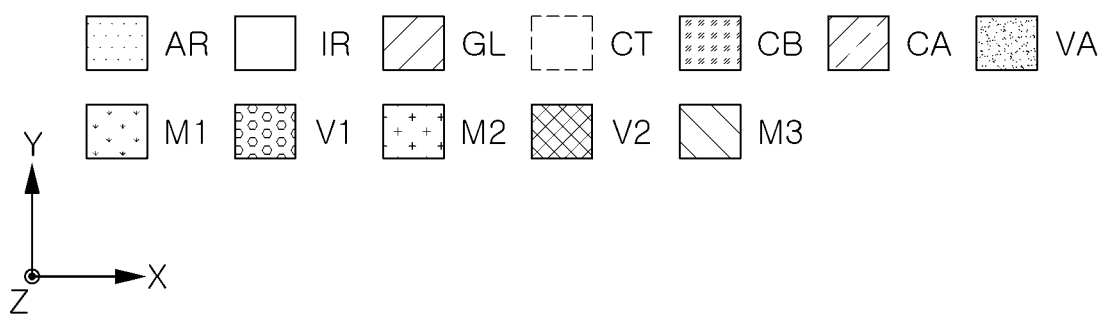
Figure 10:
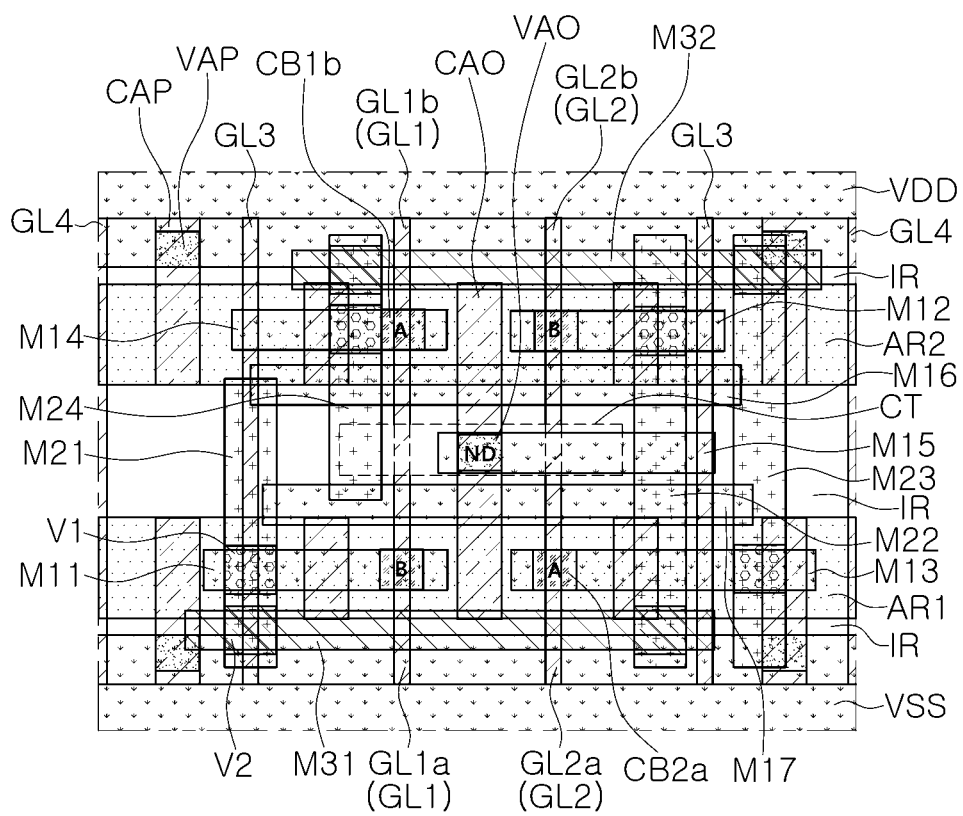
FIG. 10 is a diagram illustrating a layout of a portion of a standard cell according to another example embodiment of the present inventive concept.
Figure 10:
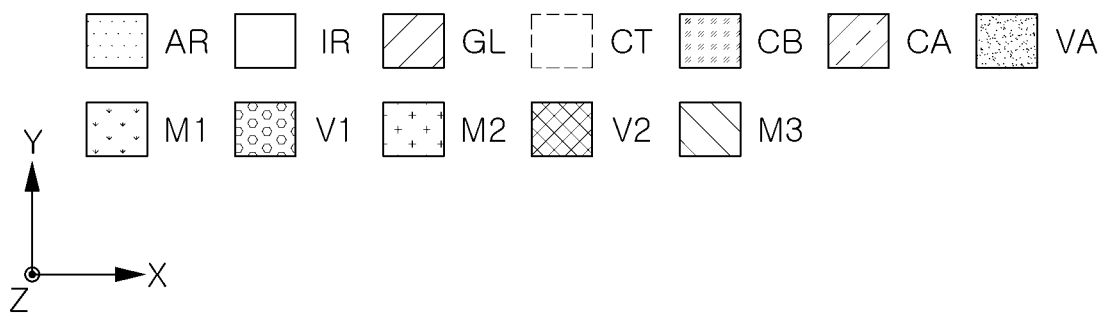

FIG. 9 is a diagram illustrating a layout of a portion of a standard cell 100C according to another example. FIG. 10 is a diagram illustrating a layout of a portion of a standard cell 100D according to another example embodiment. The descriptions overlapping the descriptions described with reference to FIGS. 2 and 3 will not be repeated.

Referring to FIGS. 9 and 10, standard cells 100C and 100D in another example embodiment may further include a sixth lower wiring layer M16 and/or a seventh lower wiring layer M17 extending in the first direction X and spaced apart from a fifth lower wiring layer M15. At least a portion of the sixth and seventh lower wiring layers M16 and M17 may overlap an isolation region IR. The sixth and seventh lower wiring layers M16 and M17 may be provided for the other elements included in the other standard cell. The sixth and seventh lower wiring layers M16 and M17 may be disposed to be parallel to the other lower wiring layers M11, M12, M13, M14, and M15. The sixth and seventh lower wiring layers M16 and M17 may be disposed between power wiring layers VSS and VDD disposed on an upper end and a lower end of a standard cell 100D, respectively, and the first to fourth lower wiring layers M11, M12, M13, and M14 may be closer to the power wiring layers VSS and VDD than the sixth and seventh lower wiring layers M16 and M17. Also, the sixth and seventh lower wiring layers M16 and M17 may be closer to the gate cutting region CT than the first to fourth lower wiring layers M11, M12, M13, and M14. For example, the fifth lower wiring layer M15 overlapping the gate cutting region CT may be disposed between the sixth and seventh lower wiring layers M16 and M17.

Accordingly, even when the standard cells 100C and 100D include the lower wiring layers M1 having at least four or five lines parallel to each other, congestion of the lower wiring layers M1 may be reduced, and a distance between the gate cutting region CT and the gate contacts CB1a, CB1b, CB2a, and CB2b may be such that a process margin for forming a gate contact may be secured.

According to the aforementioned example embodiment, by disposing the gate contacts on the same line, a semiconductor integrated circuit including a standard cell in which congestion of the wiring layers are reduced may be provided.

While the example embodiments have been shown and described above, it will be apparent to those skilled in the art that modifications and variations could be made without departing from the scope of the present inventive concept as defined by the appended claims.

What is claimed is:
1. A semiconductor integrated circuit, comprising:
a substrate; and
a standard cell on the substrate,
wherein the standard cell includes:
first and second active regions extending in a first direction on the substrate and spaced apart from each other in a second direction perpendicular to the first direction;
an isolation region disposed between the first and second active regions;
a pair of gate lines extending parallel to each other in the second direction on opposite sides of the standard cell, wherein the pair of gate lines are spaced apart from each other in the first direction and overlap the first and second active regions;

a first gate pattern disposed between the pair of gate lines, and extending in the second direction on the first active region;

a second gate pattern extending in the second direction on the second active region, wherein the first gate pattern and the second gate pattern are disposed along a first line extending in the second direction;

a third gate pattern disposed between the pair of gate lines, spaced apart from the first gate pattern in the first direction on the first active region, and arranged to be parallel to the first gate pattern;

a fourth gate pattern spaced apart from the second gate pattern in the first direction on the second active region, arranged to be parallel to the second gate pattern, wherein the third gate pattern and the fourth gate pattern are disposed along a second line extending in the second direction and spaced apart from the first line in the first direction;

a gate cutting region disposed between the first gate pattern and the second gate pattern and between the third gate pattern and the fourth gate pattern on the isolation region;

a common contact line extending in the second direction between the first and third gate patterns and the second and fourth gate patterns and overlapping the first and second active regions;

a first wiring structure configured to electrically connect the first gate pattern to the fourth gate pattern, wherein the first wiring structure includes a first lower wiring layer extending in the first direction on the first active region and overlapping the first gate pattern on the first gate pattern, a second lower wiring layer extending in the first direction on the second active region and overlapping the fourth gate pattern on the fourth gate pattern, first and second intermediate wiring layers overlapping the first and second lower wiring layers on the first and second lower wiring layers, respectively, and extending in the second direction, and a first upper wiring layer overlapping the first and second intermediate wiring layers on the first and second intermediate wiring layers and extending in the first direction;

a second wiring structure configured to electrically connect the second gate pattern to the third gate pattern, wherein the second wiring structure includes a third lower wiring layer extending in the first direction on the first active region and overlapping the third gate pattern on the third gate pattern, a fourth lower wiring layer extending in the first direction on the second active region and overlapping the second gate pattern on the second gate pattern, third and fourth intermediate wiring layers overlapping the third and fourth lower wiring layers on the third and fourth lower wiring layers, respectively, and extending in the second direction, and a second upper wiring layer overlapping the third and fourth intermediate wiring layers on the third and fourth intermediate wiring layers, and extending in the first direction; and a fifth lower wiring layer extending in the first direction on the isolation region and overlapping the common contact line on the common contact line.

2. The semiconductor integrated circuit of claim 1, wherein the first and second wiring structures are spaced apart from each other.

3. The semiconductor integrated circuit of claim 1, wherein the first to fourth gate patterns include portions disposed on the same level in a third direction perpendicular to the first direction and the second direction.

4. The semiconductor integrated circuit of claim 1, wherein the first lower wiring layer and the third lower wiring layer are disposed along a first straight line extending in the first direction, wherein the second lower wiring layer and the fourth lower wiring layer are disposed along a second straight line extending in the first direction, and wherein the first straight line is spaced apart from the second straight line in the second direction.

5. The semiconductor integrated circuit of claim 1, wherein the standard cell further includes:

a first gate contact electrically connecting the first gate pattern to the first lower wiring layer and disposed between the first gate pattern and the first lower wiring layer;

a second gate contact electrically connecting the second gate pattern to the fourth lower wiring layer and disposed between the second gate pattern and the fourth lower wiring layer;

a third gate contact electrically connecting the third gate pattern to the third lower wiring layer and disposed between the third gate pattern and the third lower wiring layer; and a fourth gate contact electrically connecting the fourth gate pattern to the second lower wiring layer and disposed between the fourth gate pattern and the second lower wiring layer, wherein the first gate contact and the third gate contact are disposed along a first straight line extending in the first direction, wherein the second gate contact and the fourth gate contact are disposed along a second straight line in the first direction, and wherein the first straight line is spaced apart from the second straight line in the second direction.

6. The semiconductor integrated circuit of claim 1, wherein the standard cell further includes:

a first cutting region disposed between the first lower wiring layer and the third lower wiring layer on the first active region; and a second cutting region disposed between the second lower wiring layer and the fourth lower wiring layer on the second active region.

7. The semiconductor integrated circuit of claim 1, wherein the first lower wiring layer and the third lower wiring layer overlap the first active region in a third direction perpendicular to the first direction and the second direction, and wherein the second lower wiring layer and the fourth lower wiring layer overlap the second active region in the third direction.

8. The semiconductor integrated circuit of claim 1, wherein one of the first and second intermediate wiring layers overlap the first and second active regions in a third direction perpendicular to the first direction and the second direction, and wherein one of the third and fourth intermediate wiring layers overlap the first and second active regions in the third direction.

9. The semiconductor integrated circuit of claim 8, wherein the other intermediate wiring layer of the first and second intermediate wiring layers and the other intermediate wiring layer of the third and fourth intermediate wiring layers do not overlap the second and first active regions in the third direction, respectively.

10. The semiconductor integrated circuit of claim 1, wherein at least one lower wiring layer of the first to fourth lower wiring layers has a width equal to or less than a distance between the first gate pattern and the third gate pattern in the first direction.

11. The semiconductor integrated circuit of claim 10, wherein an intermediate wiring layer of the first to fourth intermediate wiring layers disposed on the at least one lower wiring layer overlaps at least one of the first to fourth gate patterns in a third direction perpendicular to the first direction and the second direction.

12. The semiconductor integrated circuit of claim 11, wherein the standard cell includes a gate contact connecting the at least one lower wiring layer to one of the first to fourth gate patterns, and a lower contact via connecting the intermediate wiring layer disposed on the at least one lower wiring layer to the at least one lower wiring layer, and wherein the gate contact and the lower contact via overlap each other in the third direction.

13. The semiconductor integrated circuit of claim 1, wherein the standard cell further includes an output via disposed between the common contact line and the fifth lower wiring layer and electrically connecting the common contact line to the fifth lower wiring layer, and wherein the output via overlaps the isolation region in a third direction perpendicular to the first direction and the second direction.

14. The semiconductor integrated circuit of claim 1, wherein the standard cell further includes a sixth lower wiring layer parallel to each of the first to fifth lower wiring layers, and wherein at least a portion of the sixth lower wiring layer overlaps the isolation region in a third direction perpendicular to the first direction and the second direction.

15. The semiconductor integrated circuit of claim 14, wherein the standard cell further includes a seventh lower wiring layer parallel to the sixth lower wiring layer, and wherein the fifth lower wiring layer is disposed between the sixth lower wiring layer and the seventh lower wiring layer.

16. The semiconductor integrated circuit of claim 1, wherein each of the first to fourth lower wiring layers, the first to fourth intermediate wiring layers, and the first and second upper wiring layers has a bar shape or a line shape having a unidirectional structure.

17. The semiconductor integrated circuit of claim 1, wherein the standard cell further includes:

a plurality of first semiconductor layers on the first active region, wherein the plurality of first semiconductor layers are spaced apart from each other in a third direction perpendicular to the first direction and the second direction and the first gate pattern surrounds each of the plurality of first semiconductor layers;

a plurality of second semiconductor layers on the second active region, wherein the plurality of second semiconductor layers are spaced apart from each other in the third direction and the second gate pattern surrounds each of the plurality of second semiconductor layers;

a plurality of third semiconductor layers on the first active region, wherein the plurality of third semiconductor layers are spaced apart from each other in the third direction and the third gate pattern surrounds each of the plurality of third semiconductor layers; and a plurality of fourth semiconductor layers on the second active region, wherein the plurality of fourth semiconductor layers are spaced apart from each other in the third direction and the fourth gate pattern surrounds each of the plurality of fourth semiconductor layers, and wherein each of the first to fourth gate patterns extends in the second direction.

18. A semiconductor integrated circuit, comprising:
a substrate; and
a standard cell on the substrate,
wherein the standard cell includes:
first and second active regions extending in parallel to each other in a first direction and spaced apart from each other in a second direction perpendicular to the first direction;
an isolation region disposed between the first and second active regions;
first and second gate lines extending in parallel to each other in the second direction to overlap the first and second active regions and the isolation region, and spaced apart from each other in the first direction;
a common contact line extending in parallel to the first and second gate lines between the first and second gate lines;
a gate cutting region crossing the first and second gate lines on the isolation region, dividing the first gate line into a first gate pattern on the first active region and a second gate pattern on the second active region, and dividing the second gate line into a third gate pattern on the first active region and a fourth gate pattern on the second active region;
a first conductive line overlapping the first and third gate patterns and extending in the first direction;
a second conductive line overlapping the second and fourth gate patterns and extending in the first direction; and
a third conductive line extending in the first direction on the isolation region and overlapping the common contact line,
wherein the first conductive line has first and third lower wiring layers separated from each other, the first lower wiring layer overlaps the first gate pattern, and the third lower wiring layer overlaps the third gate pattern,
wherein the second conductive line has second and fourth lower wiring layers separated from each other, the second lower wiring layer overlaps the fourth gate pattern, and the fourth lower wiring layer overlaps the second gate pattern,
wherein the first gate pattern and the fourth gate pattern are electrically connected to each other through the first and second lower wiring layers, first and second intermediate wiring layers overlapping the first and second lower wiring layers, respectively, and extending in the second direction, and a first upper wiring layer overlapping the first and second intermediate wiring layers and extending in the first direction,
wherein the second gate pattern and the third gate pattern are electrically connected to each other through the third and fourth lower wiring layers, third and fourth intermediate wiring layers overlapping the third and fourth lower wiring layers, respectively, and extending in the second direction, and a second upper wiring layer overlapping the third and fourth intermediate wiring layers and extending in the first direction,
wherein the first to third conductive lines are parallel to one another, and wherein each of the first to fourth lower wiring layers, the first to fourth intermediate wiring layers, and the first and second upper wiring layers has a bar shape or a line shape having a unidirectional structure.

19. The semiconductor integrated circuit of claim 18, wherein the standard cell further includes:

a pair of source/drain regions spaced apart from each other in the first direction on the first active region;

a plurality of semiconductor layers spaced apart from each other in a third direction perpendicular to the first direction and the second direction between the pair of source/drain regions and disposed on the first active region; and an insulating spacer including a plurality of lower insulating spacers and an upper insulating spacer, wherein the first gate pattern surrounds the plurality of semiconductor layers on the first active region and extends in the second direction, wherein the first gate pattern includes a plurality of lower gate electrodes which are alternately stacked in the third direction with the plurality of semiconductor layers and an upper gate electrode partially covering an upper surface of an uppermost semiconductor layer of the plurality of semiconductor layers, and wherein each of the plurality of lower insulating spacers is disposed between a corresponding one of the plurality of lower gate electrodes and one of the pair of source/drain regions, and the upper insulating spacer is disposed on the upper surface of the uppermost semiconductor layer and a sidewall of the upper gate electrode.

20. A semiconductor integrated circuit, comprising:

a substrate; and a standard cell on the substrate, wherein the standard cell includes:

first and second active regions extending in a first direction and spaced apart from each other in a second direction perpendicular to the first direction;

an isolation region disposed between the first and second active regions;

a plurality of source/drain regions spaced apart from each other in the first direction on the first and second active regions;

a plurality of semiconductor layers stacked and spaced apart from each other in a third direction perpendicular to the first direction and the second direction between the plurality of source/drain regions;

a pair of gate lines extending parallel to each other in the second direction on opposite sides of the standard cell, wherein the pair of gate lines are spaced apart from each other in the first direction and overlap the first and second active regions;

first and second gate lines disposed between the pair of gate lines, extending in parallel to each other in the second direction on the first and second active regions and the isolation region, and spaced apart from each other in the first direction, where the first and second gate lines surround the plurality of semiconductor layers on the first and second active regions, respectively;

a common contact line disposed between the first and second gate lines, extending in parallel to the first and second gate lines on the first and second active regions and the isolation region, and overlapping the plurality of source/drain regions on the first and second active regions;

a gate cutting region crossing the first and second gate lines on the isolation region, dividing the first gate line into a first gate pattern on the first active region and a second gate pattern on the second active region, and dividing the second gate line into a third gate pattern on the first active region and a fourth gate pattern on the second active region;

a first conductive line overlapping the first and third gate patterns and extending in the first direction;

a second conductive line overlapping the second and fourth gate patterns and extending in the first direction; and a third conductive line overlapping the common contact line on the isolation region and extending in the first direction, wherein the first conductive line has first and third lower wiring layers separated from each other, the first lower wiring layer overlaps the first gate pattern, and the third lower wiring layer overlaps the third gate pattern, wherein the second conductive line has second and fourth lower wiring layers separated from each other, the second lower wiring layer overlaps the fourth gate pattern, and the fourth lower wiring layer overlaps the second gate pattern, wherein the first gate pattern and the fourth gate pattern are electrically connected to each other through the first and second lower wiring layers, first and second intermediate wiring layers overlapping the first and second lower wiring layers, respectively, and extending in the second direction, and a first upper wiring layer overlapping the first and second intermediate wiring layers and extending in the first direction, and wherein the second gate pattern and the third gate pattern are electrically connected to each other through the third and fourth lower wiring layers, third and fourth intermediate wiring layers overlapping the third and fourth lower wiring layers, respectively, and extending in the second direction, and a second upper wiring layer overlapping the third and fourth intermediate wiring layers and extending in the first direction.

* * * * *